US009688060B2

(12) United States Patent
Bayerer et al.

(10) Patent No.: US 9,688,060 B2
(45) Date of Patent: Jun. 27, 2017

(54) METHOD FOR PRODUCING A COMPOSITE AND A POWER SEMICONDUCTOR MODULE

(75) Inventors: Reinhold Bayerer, Warstein (DE); Olaf Hohlfeld, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 455 days.

(21) Appl. No.: 13/571,417

(22) Filed: Aug. 10, 2012

(65) Prior Publication Data
US 2013/0203218 A1    Aug. 8, 2013

(30) Foreign Application Priority Data
Aug. 12, 2011   (DE) .................. 10 2011 080 929

(51) Int. Cl.
*B23K 37/04*    (2006.01)
*H01L 21/58*    (2006.01)
(Continued)

(52) U.S. Cl.
CPC .............. *B32B 37/10* (2013.01); *H01L 21/50* (2013.01); *H01L 21/566* (2013.01);
(Continued)

(58) Field of Classification Search
CPC ... B32B 37/10; B29C 2043/561; B29C 43/56; B29C 65/002; B29C 66/8161;
(Continued)

(56) References Cited

U.S. PATENT DOCUMENTS 4,933,042 A * 6/1990 Eichelberger ........... H01L 21/56
156/239
5,352,629 A * 10/1994 Paik ........................ H01L 23/13
228/123.1
(Continued)

FOREIGN PATENT DOCUMENTS

| CN | 101436556 A | 5/2009 |
| JP | 2010021227 A | 1/2010 |
| KR | 20110014782 A | 2/2011 |

OTHER PUBLICATIONS

Michele et al. [WIPO Publication 2010086282].*
(Continued)

*Primary Examiner* — John C Ingham
*Assistant Examiner* — Ismail Muse
(74) *Attorney, Agent, or Firm* — Murphy, Bilak & Homiller, PLLC

(57) ABSTRACT

A composite is produced by providing a first and a second joining partner, a connecting means, a sealing means, a reactor having a pressure chamber, and a heating element. The two joining partners and the connecting means are arranged in the pressure chamber such that the connecting means is situated between the first joining partner and the second joining partner. A gas-tight region is then produced, in which the connecting means is arranged. Afterward, a gas pressure of at least 20 bar is produced in the pressure chamber outside the gas-tight region. The gas pressure acts on the gas-tight region and presses the first joining partner, the second joining partner and the connecting means together. The joining partners and the connecting means are then heated by means of the heating element to a predefined maximum temperature of at least 210° C. and then cooled.

29 Claims, 25 Drawing Sheets

(51) Int. Cl.

| | | |
|---|---|---|
| *B29C 65/02* | (2006.01) | |
| *H01L 21/30* | (2006.01) | |
| *B32B 37/10* | (2006.01) | |
| *H01L 21/50* | (2006.01) | |
| *H01L 25/07* | (2006.01) | |
| *H01L 25/00* | (2006.01) | |
| *H01L 21/56* | (2006.01) | |
| *H01L 23/373* | (2006.01) | |
| *H01L 23/00* | (2006.01) | |

(52) U.S. Cl.
CPC .......... *H01L 23/3735* (2013.01); *H01L 24/75* (2013.01); *H01L 25/072* (2013.01); *H01L 25/50* (2013.01); *H01L 24/83* (2013.01); *H01L 2224/29339* (2013.01); *H01L 2224/32225* (2013.01); *H01L 2224/7511* (2013.01); *H01L 2224/75102* (2013.01); *H01L 2224/75265* (2013.01); *H01L 2224/75317* (2013.01); *H01L 2224/81191* (2013.01); *H01L 2224/81192* (2013.01); *H01L 2224/83007* (2013.01); *H01L 2224/8384* (2013.01); *H01L 2224/8385* (2013.01); *H01L 2224/83801* (2013.01); *H01L 2224/83825* (2013.01); *H01L 2924/01327* (2013.01); *H01L 2924/15787* (2013.01)

(58) Field of Classification Search
CPC ...... H01R 12/62; H01R 12/7076; H01R 4/04; H05K 3/305; H05K 3/321; H05K 3/36
See application file for complete search history.

(56) References Cited

U.S. PATENT DOCUMENTS

| | | | | |
|---|---|---|---|---|
| 5,800,667 | A * | 9/1998 | Kosaki et al. | ................ 156/382 |
| 6,013,944 | A * | 1/2000 | Moriya | ................ H01L 24/81 |
| | | | | 257/668 |
| 6,168,963 | B1 * | 1/2001 | Freund et al. | ................ 438/26 |
| 6,169,323 | B1 * | 1/2001 | Sakamoto | ............... H01L 23/31 |
| | | | | 257/667 |
| 6,821,819 | B1 | 11/2004 | Benavides et al. | |
| 7,525,187 | B2 * | 4/2009 | Speckels | ................ H01L 23/48 |
| | | | | 257/688 |
| 8,209,858 | B2 * | 7/2012 | Speckels | ........... H01L 21/67144 |
| | | | | 228/180.1 |
| 8,708,021 | B2 * | 4/2014 | Matsumura | ............. H01L 24/75 |
| | | | | 100/260 |
| 2003/0016510 | A1 * | 1/2003 | Knapp | .......... 361/761 |
| 2003/0102356 | A1 * | 6/2003 | Schwarzbauer | .... H01L 23/3736 |
| | | | | 228/121 |
| 2004/0155356 | A1 * | 8/2004 | Furukuwa | ........ 257/777 |
| 2005/0269696 | A1 * | 12/2005 | Ochiai | ................ H01L 21/6835 |
| | | | | 257/734 |
| 2006/0009009 | A1 * | 1/2006 | Hara | ................ H01L 21/67092 |
| | | | | 438/464 |
| 2008/0153258 | A1 * | 6/2008 | Thallner | ........ 438/455 |
| 2009/0032570 | A1 * | 2/2009 | Matsumura | ............... B30B 5/02 |
| | | | | 228/123.1 |
| 2010/0112454 | A1 * | 5/2010 | Visco et al. | ................ 429/246 |
| 2010/0142189 | A1 * | 6/2010 | Hong | ................ C09K 11/616 |
| | | | | 362/97.3 |
| 2010/0176751 | A1 * | 7/2010 | Oshio | ................ H01L 33/62 |
| | | | | 315/362 |
| 2011/0121450 | A1 * | 5/2011 | Tsukada | ........... H01L 23/49827 |
| | | | | 257/737 |
| 2011/0182072 | A1 * | 7/2011 | Shimizu | ............. C09K 11/7739 |
| | | | | 362/293 |
| 2012/0037939 | A1 * | 2/2012 | Urano | ................ H01L 33/486 |
| | | | | 257/98 |

OTHER PUBLICATIONS

English Translation Urano; Youji, WO 2010119830.*
English Translation of Youji Urano, [WO2010119830], Oct. 21, 2010.*
English translation of Michele et al. [WO2010086282], Aug. 5, 2010.*

* cited by examiner

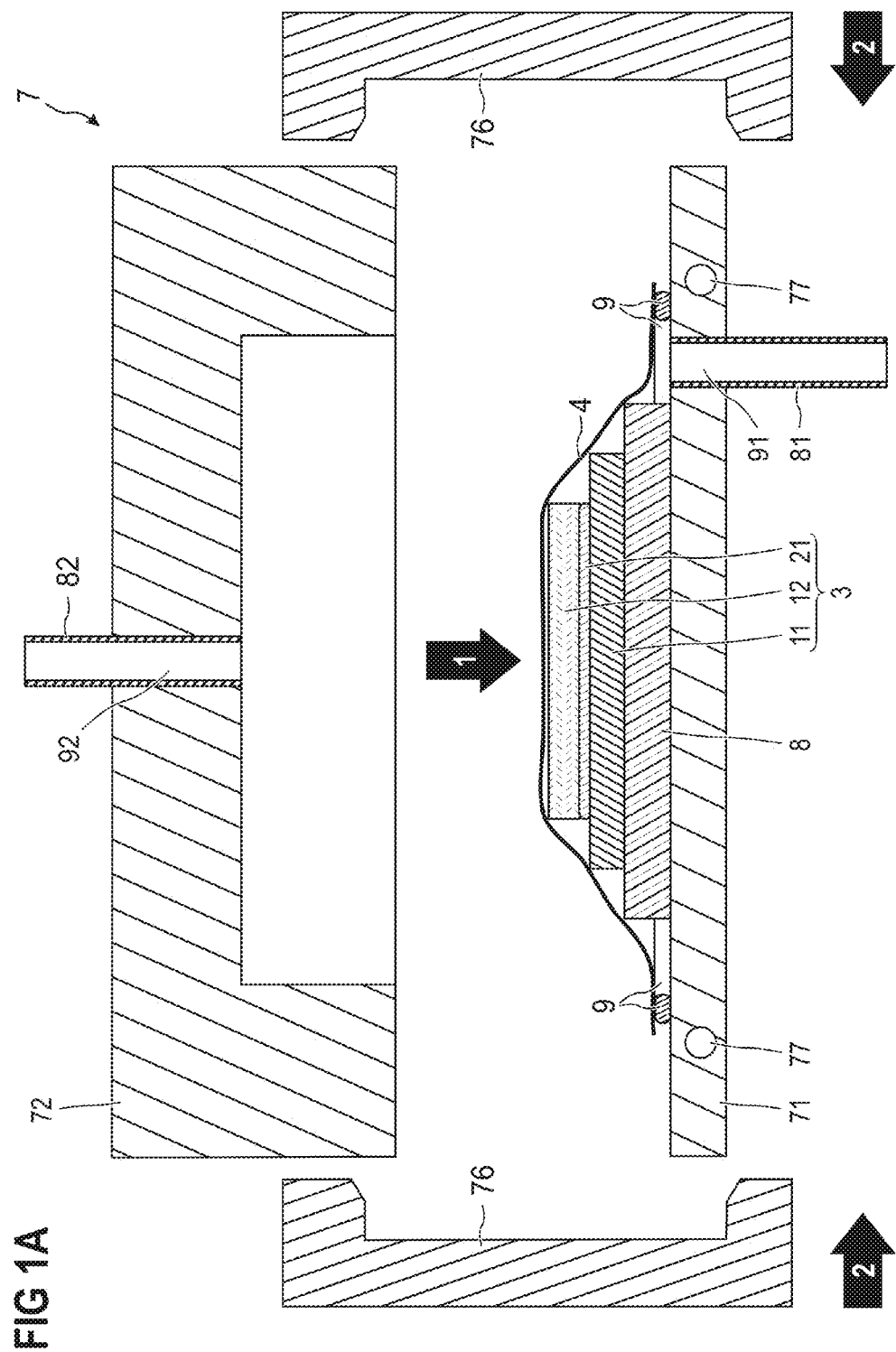

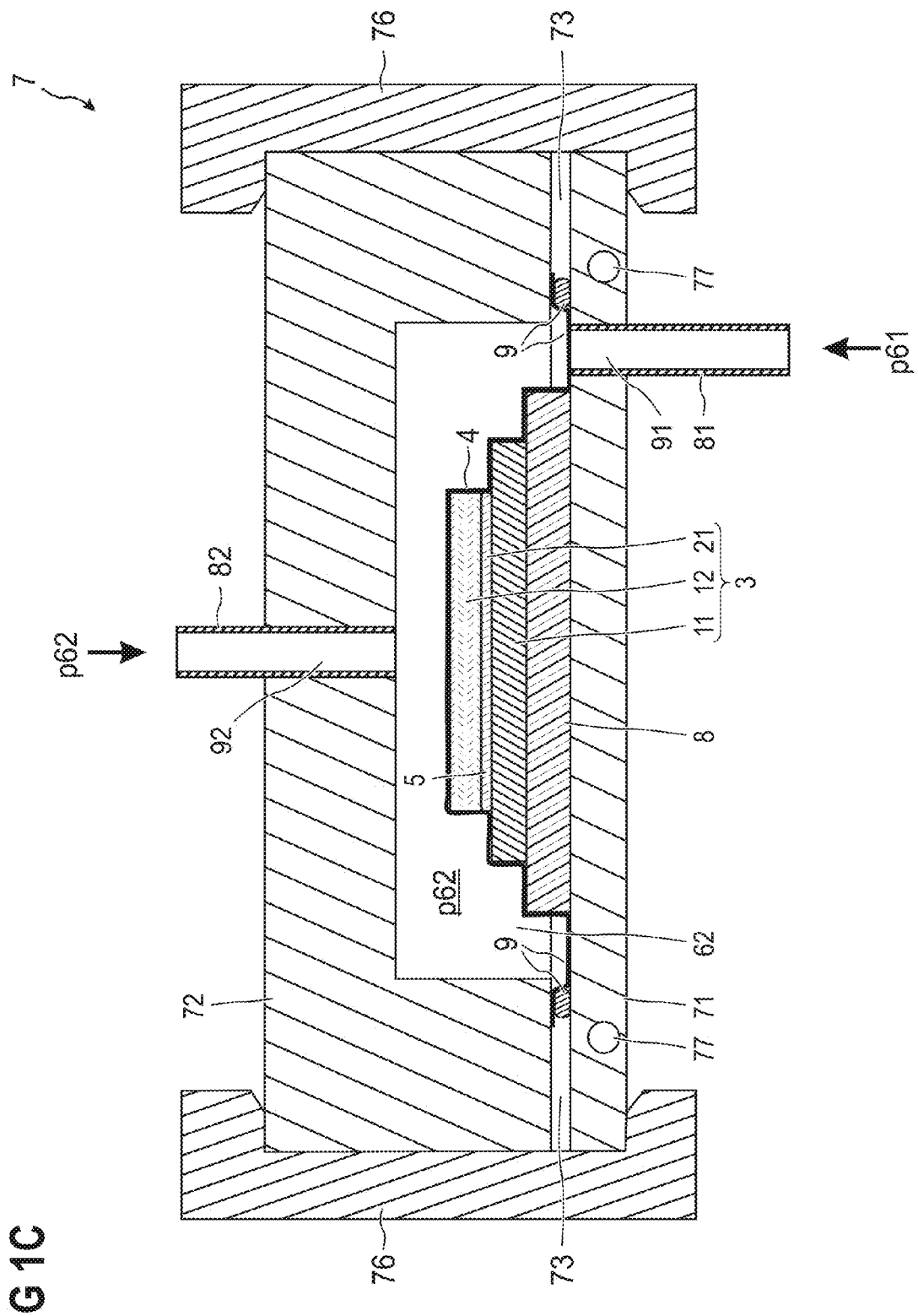

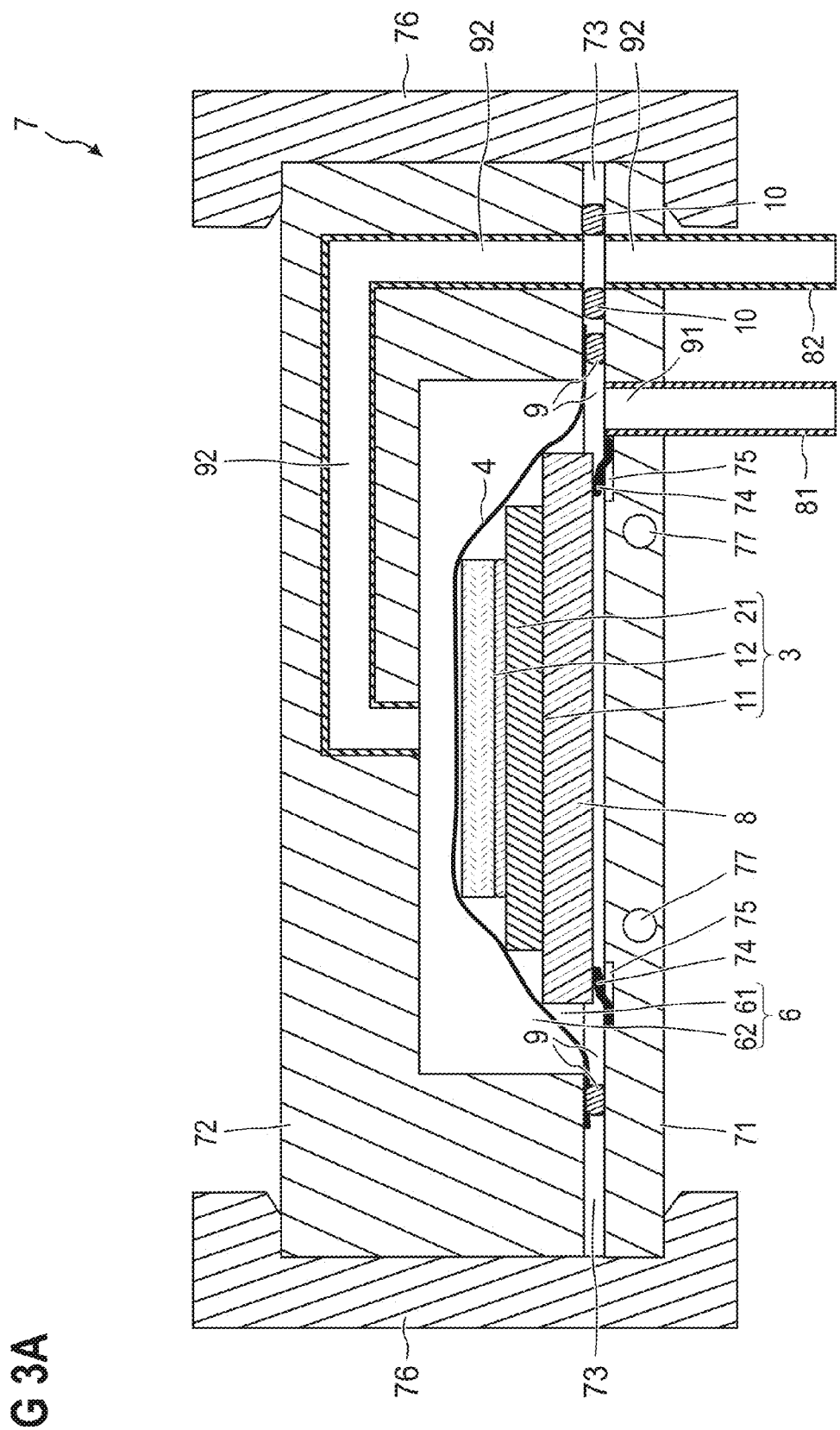

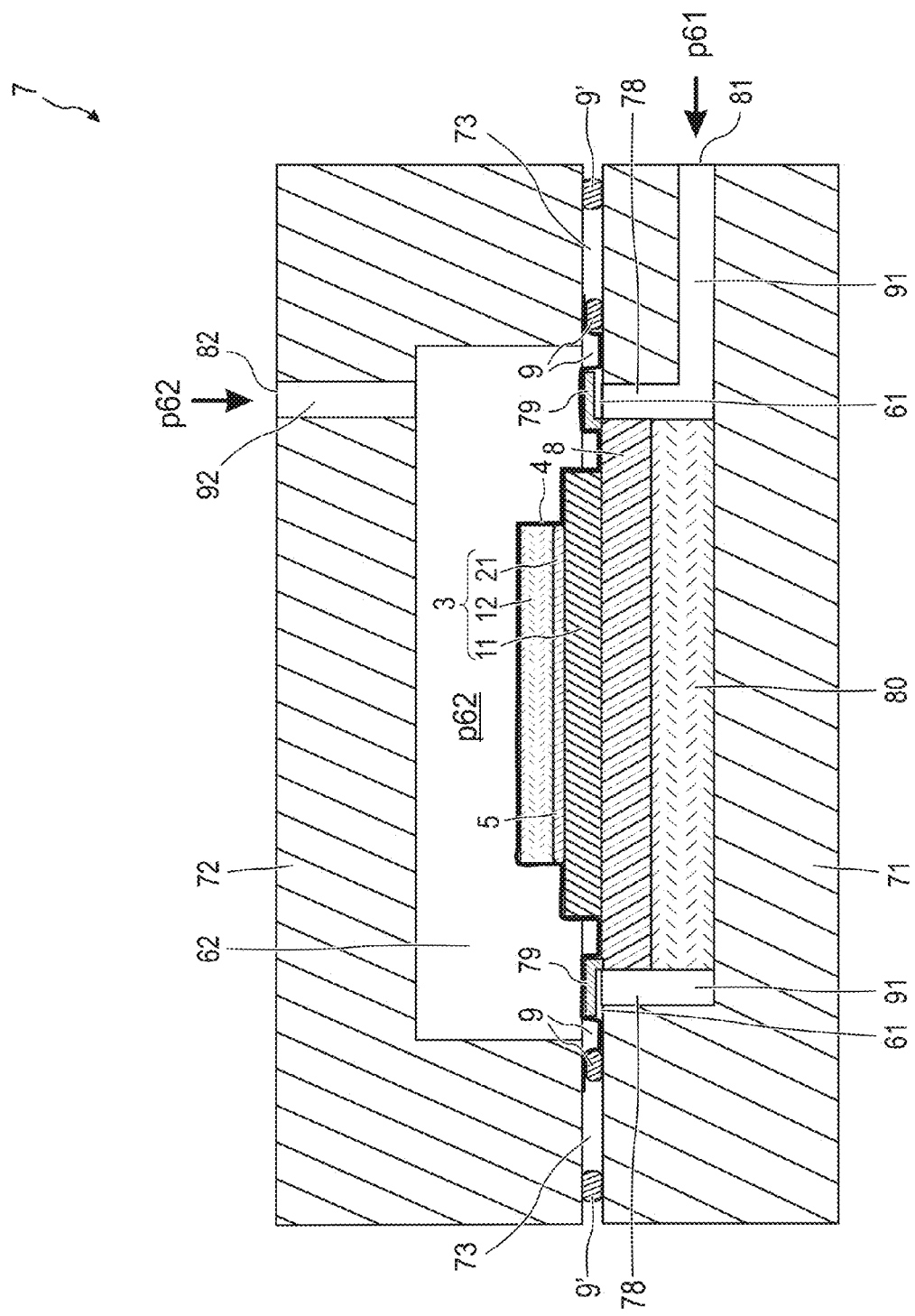

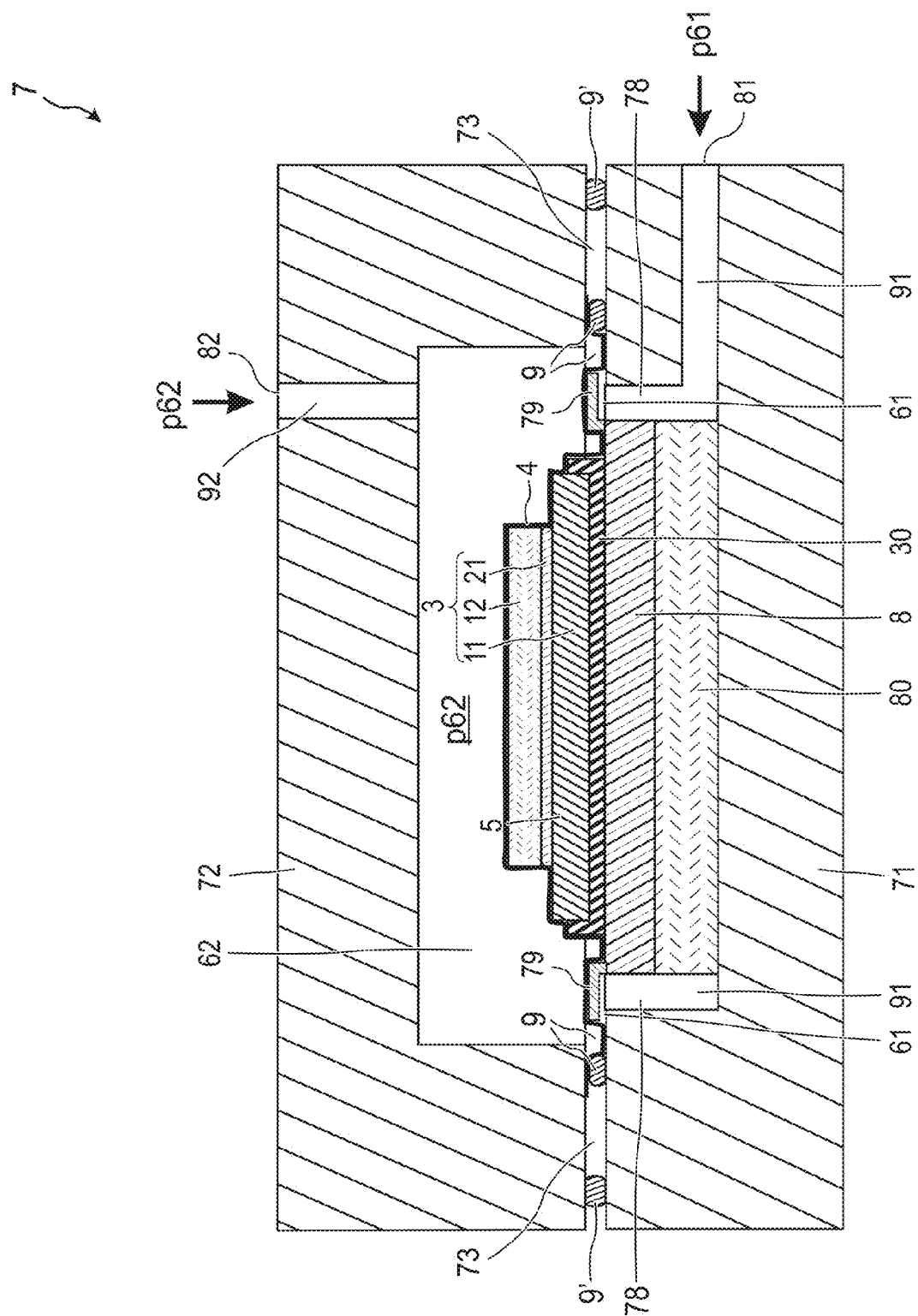

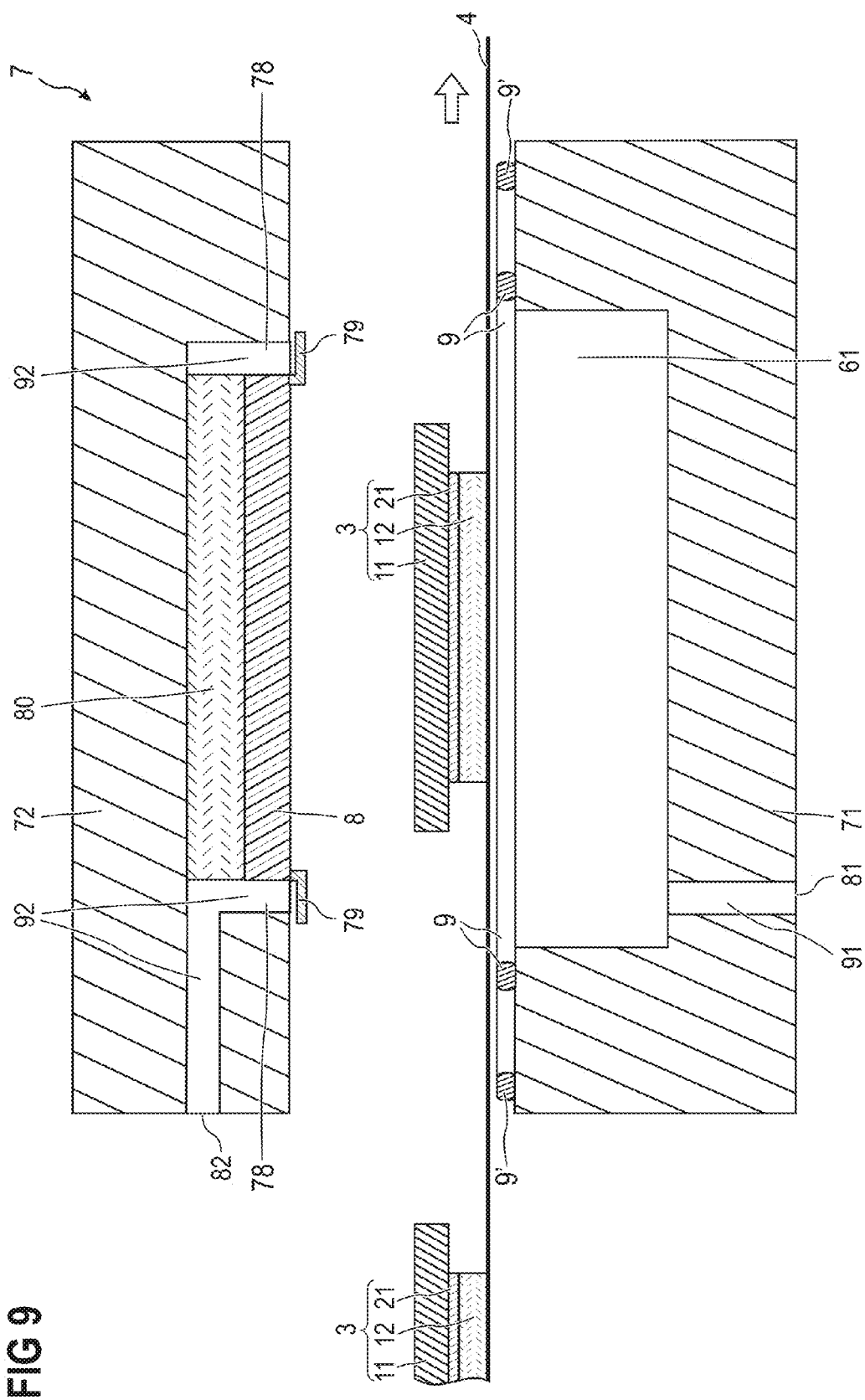

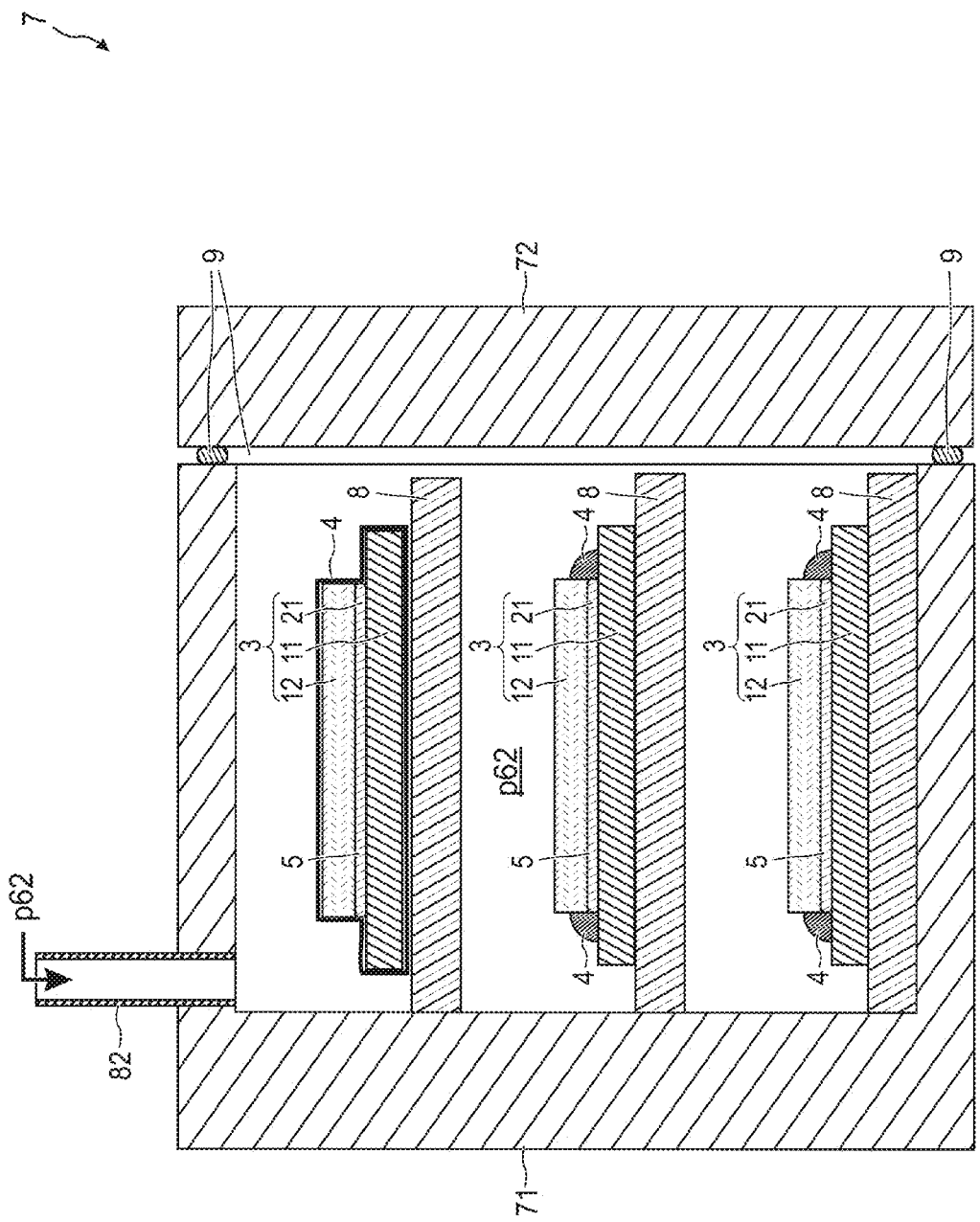

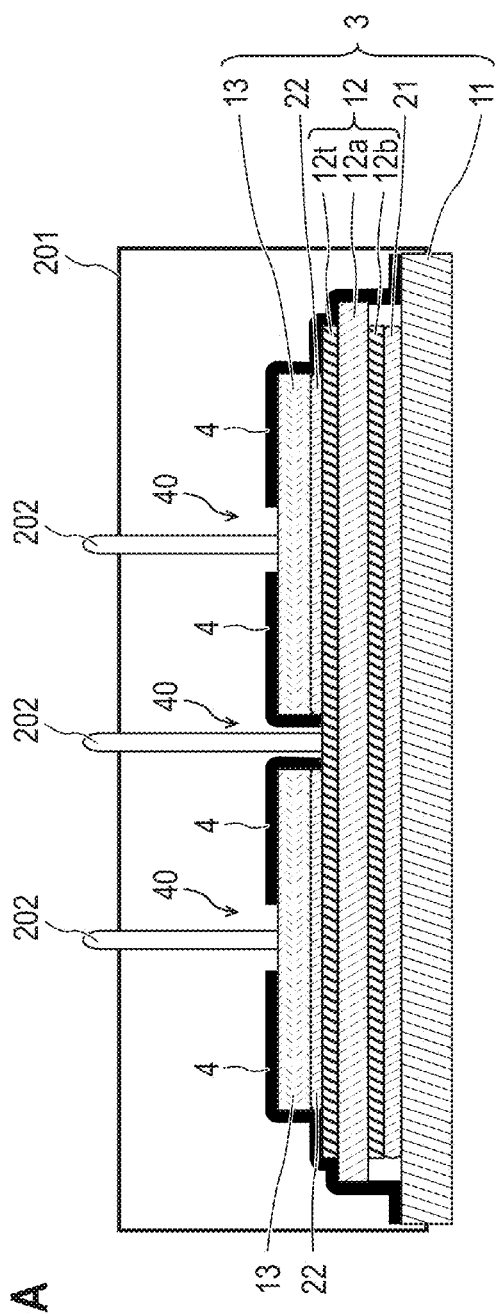
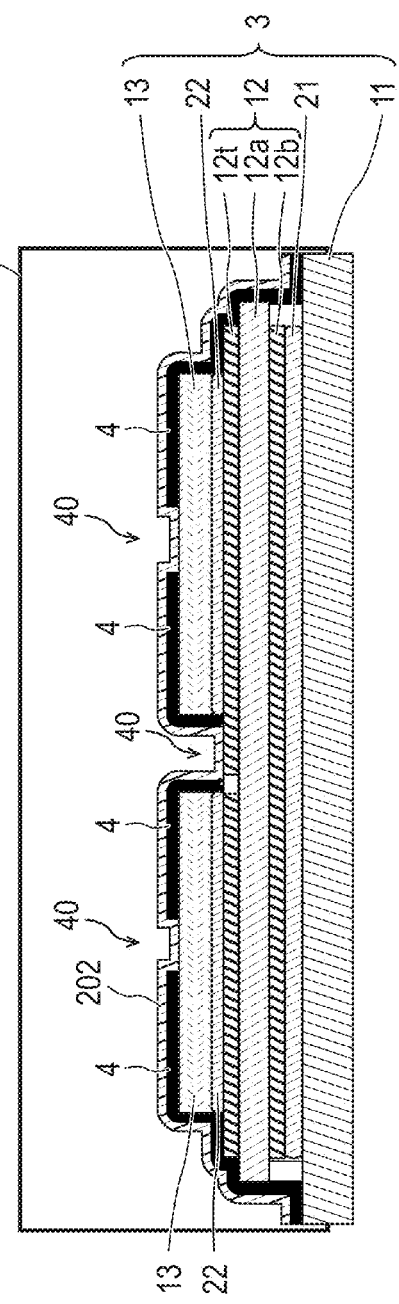
FIG 13A
FIG 13B

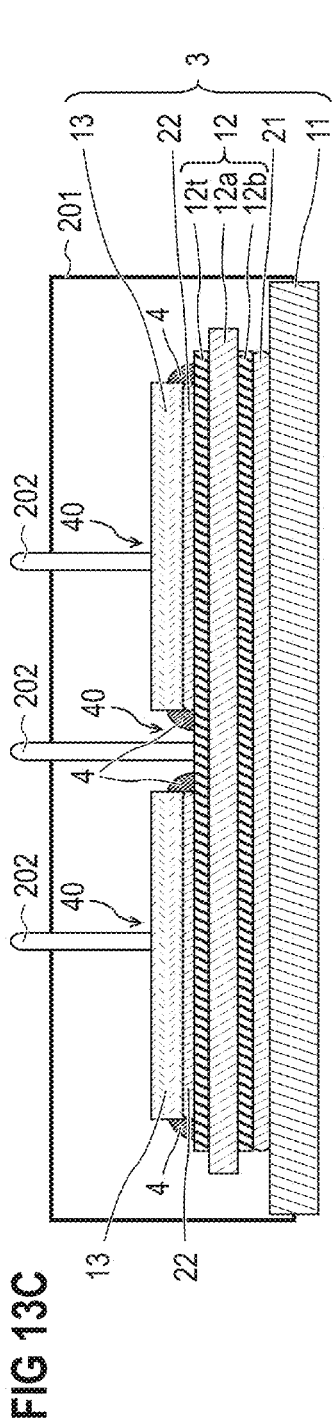
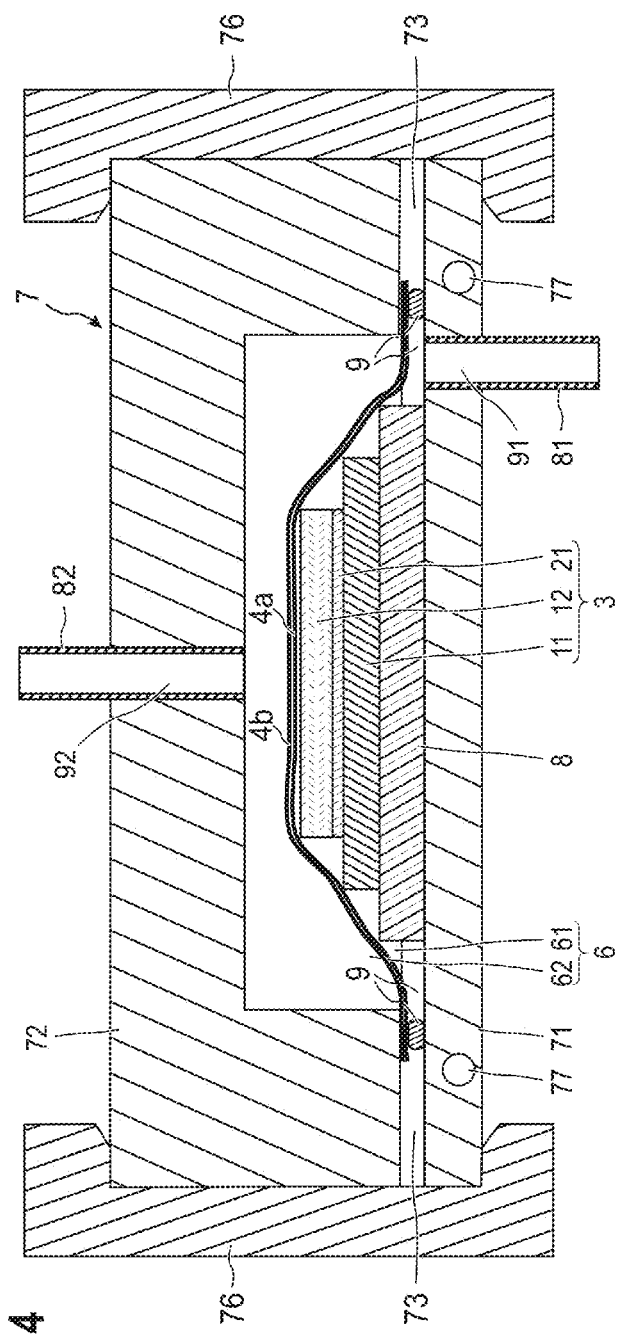

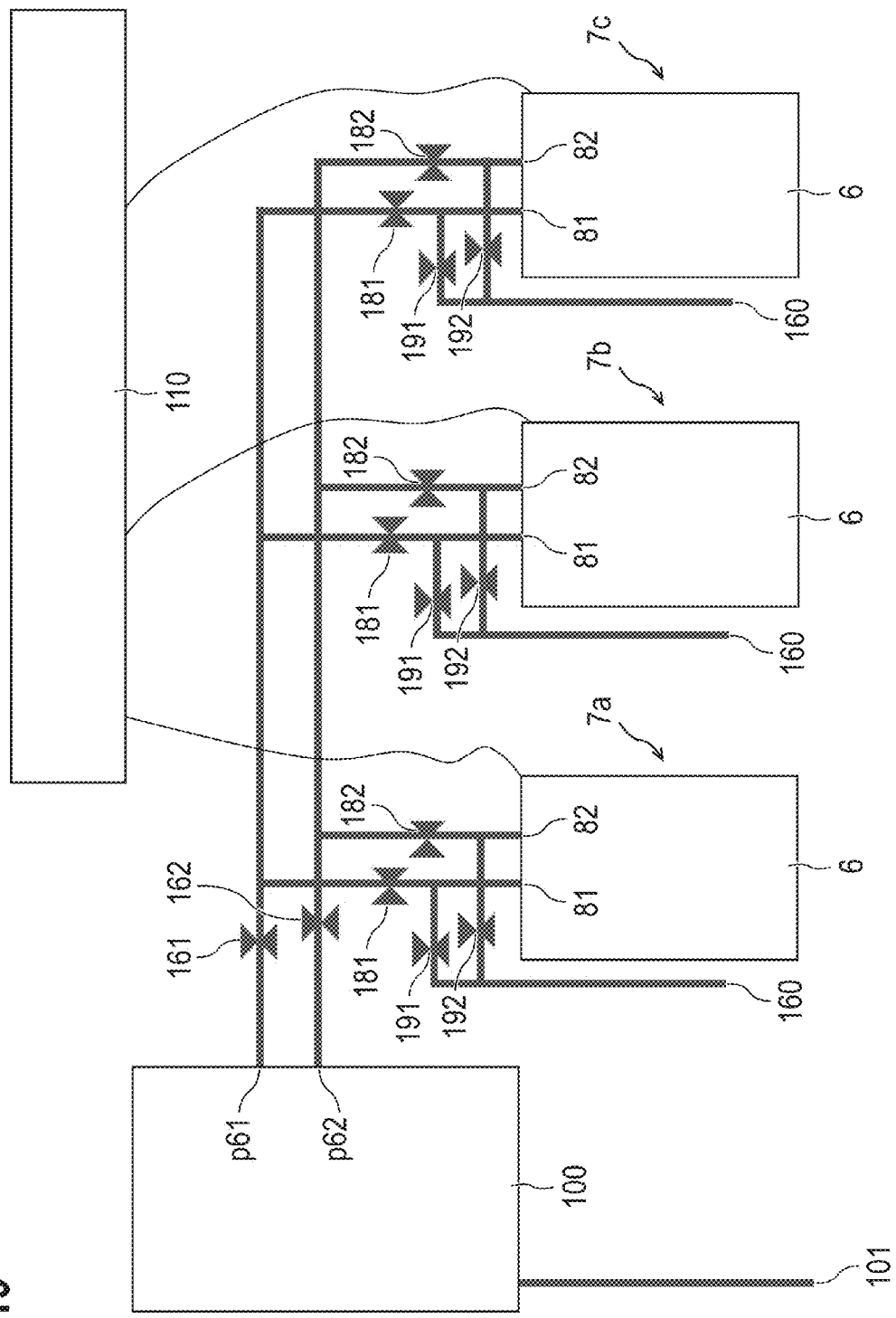

US 9,688,060 B2

METHOD FOR PRODUCING A COMPOSITE AND A POWER SEMICONDUCTOR MODULE

PRIORITY CLAIM

This application claims priority to German Patent Application No. 102011080929.5, filed on 12 Aug. 2011, the content of said German application incorporated herein by reference in its entirety.

TECHNICAL FIELD

The present application relates to a method for producing a composite and for producing a power semiconductor module.

BACKGROUND

In many technical fields, it is necessary for two or more joining partners to be connected to one another cohesively and for the joining partners to be pressed onto one another for this purpose. In conventional methods, there is often the risk of the joining partners being damaged during or after the connecting process or being contaminated with impurities such as oil, for example.

SUMMARY

A first aspect of the invention relates to a method for producing a composite, wherein at least two joining partners are fixedly connected to one another. For this purpose, provision is made of a first joining partner, a second joining partner, a connecting means, a sealing means, a pressure reactor and a heating element. The pressure reactor has a pressure chamber. The first joining partner, the second joining partner and the connecting means are arranged in the pressure chamber such that the connecting means is situated between the first joining partner and the second joining partner. Moreover, a gas-tight region is produced, in which the connecting means is arranged, wherein the gas-tight region can be delimited by the first joining partner, the second joining partner and the sealing means. Furthermore, a gas pressure of at least 20 bar is produced in the pressure chamber outside the gas-tight region, such that the gas pressure acts on the gas-tight region and presses the first joining partner, the second joining partner and the connecting means together. The first joining partner, the second joining partner and the connecting means are heated with the aid of the heating element to a predefined maximum temperature of at least 210° C. and subsequently cooled.

The sealing means can be embodied, for example, as a film or as a sealing bead. In the case of a film, the latter can remain wholly or partly on the completed composite and be mounted together with the latter for producing a power semiconductor module in a housing for the power semiconductor module. The film can then be used as protective coating and/or as insulation. In the case of such a power semiconductor module, one of the joining partners can be a metalized ceramic carrier and the other joining partner can be a semiconductor chip.

According to another embodiment, a method for producing a composite comprises: arranging a connecting means between a first joining partner and a second joining partner in a pressure chamber of a reactor; producing a gas-tight region in which the connecting means is arranged; producing a gas pressure in the pressure chamber outside the gas-tight region such that the gas pressure acts on the gas-tight region and presses the first joining partner, the second joining partner and the connecting means together with at least 20 bar; heating the first joining partner, the second joining partner and the connecting means to a maximum temperature of at least 210° C.; and subsequently cooling the first joining partner, the second joining partner and the connecting means to produce the composite.

According to an embodiment of a reactor, the reactor comprises a pressure chamber operable to receive a first joining partner, a second joining partner and a connecting means interposed between the joining partners. The reactor further comprises a film operable to subdivide the pressure chamber into a first chamber region and a second chamber region, and prevent a gas exchange between the first chamber region and the second chamber region from taking place within the pressure chamber, the connecting means and the joining partners arranged in the first chamber region. The reactor also comprises a pressure connection operable to apply a gas pressure to the second chamber region which forces the film to press the first joining partner, the second joining partner and the connecting means together with at least 20 bar, and a heater operable to heat the first joining partner, the second joining partner and the connecting means to a maximum temperature of at least 210° C.

Those skilled in the art will recognize additional features and advantages upon reading the following detailed description, and upon viewing the accompanying drawings.

BRIEF DESCRIPTION OF THE DRAWINGS

The invention is explained by way of example below on the basis of exemplary embodiments with reference to the accompanying figures. In the figures, identical reference signs designate identical or identically acting elements. In the figures:

FIG. 1A shows a vertical section through an open reactor, into which two joining partners, a connecting means and a sealing means embodied as a film are arranged;

FIG. 1C shows the reactor in accordance with FIG. 1B after high pressure is applied to a region of the pressure chamber that is separated from the joining partners and the connecting means by the film;

FIG. 3A shows a vertical section through a reactor embodied in accordance with FIG. 2 and additionally having spring elements, with which the joining partner, the connecting means and a heating plate situated in the pressure chamber can be thermally decoupled from the reactor housing given a suitable pressure in the pressure chamber;

FIG. 7 shows a vertical section through a reactor equipped with two joining partners and a connecting means with a heating element, which is thermally decoupled from the housing of the reactor by means of a plate having low thermal conductivity;

FIG. 8 shows a vertical section through an arrangement with a reactor, which differs from the arrangement in accordance with FIG. 7 in that the joining partners to be connected to one another and the connecting means are inserted into a thermally conductive carrier.

FIG. 9 shows a vertical section through an arrangement with a reactor, in which the sealing means is embodied as a tape-shaped film, on which the joining partners to be connected to one another together with the connecting means are transported into the reactor chamber;

FIG. 10 shows a vertical section through a reactor, the pressure chamber of which is equipped with a plurality of stacks of joining partners that are respectively to be connected to one another;

FIG. 13A shows a vertical section through a power semiconductor module produced with inclusion of the present joining method, in which module part of the sealing means remains on the joining partners, and which module has connection elements embodied as connection metal sheets or connection pins;

FIG. 13B shows a vertical section through a power semiconductor module produced with the inclusion of the present joining method, in which module part of the sealing means remains on the joining partners, and which module has a connection element embodied as a metallization layer;

FIG. 13C shows a vertical section through a power semiconductor module produced with the inclusion of the present joining method, in which module a sealing means embodied as a sealing bead remains completely on the joining partners;

FIG. 14 shows a vertical section through an arrangement comprising a reactor embodied in accordance with FIGS. 1A to 1C, in which the sealing means is embodied as a double film;

FIG. 19 shows a block diagram with a plurality of reactors coupled to one another.

DETAILED DESCRIPTION

Figure 1B:
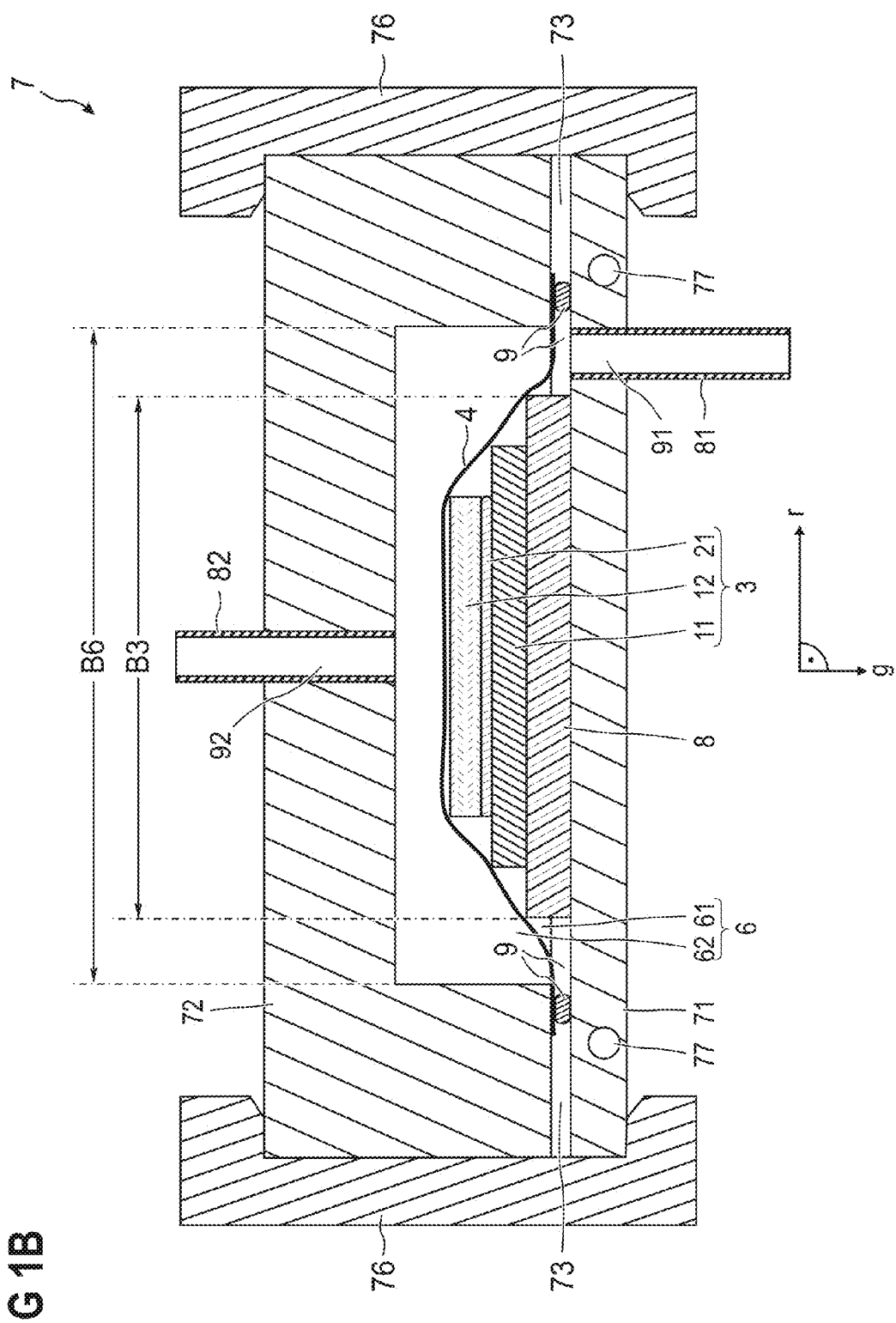
FIG. 1B shows the closed reactor in accordance with FIG. 1A.

FIG. 1A shows a cross section through a reactor 7 having a pressure chamber 6. A stack 3 comprising a first joining partner 11, a second joining partner 12 to be connected to the first joining partner 11, and a connecting means 21 is inserted into the pressure chamber 6. The first joining partner 11 can be, for example, a metalized ceramic substrate and the second joining partner 12 can be a semiconductor chip. Likewise, the first joining partner 11 can also be a metallic plate and the second joining partner 12 can be a metalized ceramic substrate. In principle, the first and second joining partners 11, 12 can be, however, arbitrary elements to be connected to one another. Therefore, the joining partners 11, 12 are in each case only illustrated schematically.

The connecting means 21 serves to cohesively connect the first joining partner 11 to the second joining partner 12 during a connecting process after the reactor 7 has been closed. The connecting process can be, for example, a soldering process, a sintering process or an adhesive bonding process. Accordingly, depending on the desired process, the connecting means 21 can be a solder, an adhesive or a sinterable layer. A sinterable layer can be e.g. a sinterable paste or a sinterable film that is applied to one or both joining partners. It is likewise possible to apply a sinterable layer to one or both joining partners by spraying, screen printing or stencil printing sinterable material.

A sinterable material can be produced from a paste, for example, which comprises silver powder which is provided with a solvent and is therefore spreadable, printable or sprayable and can thus be applied to one or both joining partners 11, 12. After application, the paste can be dried with evaporation of the solvent. In order to support this drying process, the temperature can be increased and/or the pressure can be decreased. If the connecting means 21 is a sinterable material, it is advantageous if those surfaces of the joining partners 11 and 12 which face one another are provided from a noble metal, for example gold or silver.

Furthermore, a heating element 8 is provided, which bears loosely on a first housing element 71 and which serves to heat the first joining partner 11, the second joining partner 12 and the connecting means 21 during the subsequent connecting process, such that the temperature T of the connecting means 21 follows a specific temporal temperature profile during the connecting process. In this case, the stack 3 is placed loosely onto the heating element 8.

As in all other possible configurations of the invention, the heating element 8 can be embodied as an electrical resistance heating element, or as a metallic plate, e.g. aluminum, which is heated inductively. The required electrical connection lines and a possible inductor are not illustrated in the figures.

The first housing element 71 is provided with optional cooling channels 77, through which a cooling fluid, e.g. a cooling gas or a cooling liquid, can be conducted for the purpose of cooling the housing element 71.

The pressure chamber 7 comprises the first housing element 71 and a second housing element 72, which are movable relative to one another, such that the pressure chamber 6 can be opened in order to equip it with two or more joining partners 11, 12 and a corresponding number of connecting means 21, or in order to remove a completed composite between two or more joining partners 11, 12 from the pressure chamber 6. In the closed state of the reactor 7, the first housing element 71 and the second housing element 72 are pressed together using a seal 9 situated between the housing elements 71 and 72, such that a gap 73 between the first housing element 71 and the second housing element 72 is gas-tight.

A connecting means 4 embodied as a film is placed across the stack 3 such that, when the pressure chamber 6 has been closed, the connecting means 4 is clamped circumferentially in the gap 73 between the housing elements 71 and 72, and in conjunction with the seal 9, seals the gap 73 which is shown as the result in FIG. 1B. Alternatively, a sealing means 4 configured as a film can also by itself perform the function of the seal 9, such that a separate seal 9 can be dispensed with. The volume of the closed pressure chamber 6 is arbitrary, in principle; by way of example, in the case of this and also all other reactors 7, the volume can be chosen to be less than or equal to 1000 ml or even less than or equal to 200 ml. This volume indication relates only to the interior of the empty pressure chamber 6.

In addition or as an alternative thereto, the geometry of the pressure chamber 6 can be chosen such that the width B6 of the interior of the pressure chamber 6 in each lateral direction r is larger by a maximum of 1 cm than the largest width B3 of the stack 3 in the lateral direction r. In this case, the lateral direction r is considered to be any direction perpendicular to the direction of the gravitational force g.

After the reactor 7 has been closed (indicated by arrow 1 in FIG. 1A), the reactor 7 can be secured by one or more holding clamps 76 pushed onto the housing elements 71 and 72, by means of the holding clamps 76 being pushed onto the closed housing elements 71 and 72 (indicated by arrows 2 in FIG. 1A). The holding clamps 76 can also serve to press the housing elements 71 and 72 against one another and in this case to squeeze the seal 9 and/or the film 4 situated in the gap 73 and thereby to seal the gap 73, such that no gas exchange between the pressure chamber 6 and the exterior of the reactor 7 can take place via the gap 73. As an alternative or in addition to holding clamps 76 of this type, it is also possible to use any other securing and/or press-on devices, such as e.g. screw connections, plungers operated hydraulically, pneumatically or by electric motor, or knee levers.

When the reactor 7 has been closed, the film 4 subdivides the pressure chamber 6 into a first chamber region 61 and a second chamber region 62 and prevents a gas exchange between the first chamber region 61 and the second chamber region 62 from taking place within the pressure chamber 6 (apart from a very small residual diffusion which can take place through the film but which does not have a disadvantageous effect for the present method). The first chamber region 61 and the second chamber region 62 are therefore separated from one another in a substantially gas-tight fashion by the film 4, such that a difference in gas pressure in the two chamber regions 61 and 62 can equalize one another only extremely slowly.

The reactor 7 is provided with an optional first pressure connection 81 and a second pressure connection 82, which are connected to the first chamber region 61 and to the second chamber region 62, respectively, by means of a first connecting line 91 and by means of a second connecting line 92, respectively. Via the first pressure connection 81 and the first connecting line 91, a first gas pressure p61 can be applied to the first chamber region 61. Correspondingly, a second gas pressure p62 can be applied to the second chamber region 62 via the second pressure connection 82 and the second connecting line 92. In principle, the gas used can be an arbitrary gas, for example air, nitrogen (N2), oxygen (O2), argon (Ar2), helium (He2), or forming gas.

The first gas pressure p61 and the second gas pressure p62 can be, independently of one another, an excess pressure or a reduced pressure relative to the pressure of the atmosphere surrounding the reactor 7. If pressures p61 and p62 are then applied to the corresponding pressure connections 81 and 82, respectively, such that a differential pressure $\Delta p = p62 - p61$ is greater than zero, then the film 4, as is shown in FIG. 1C, is forced against the surface of the stack 3 and substantially follows the surface course or topology thereof. In this case, the film 4 seals the gap between the first joining partner 11 and the second joining partner 12, in which the connecting means 21 is situated, in a gas-tight fashion, such that the connecting means 21 is situated in a gas-tight region 5.

If the differential pressure $\Delta p$ is increased further after the gas-tight region 5 has been formed, a compression of the residual gas situated in the gas-tight region 5 occurs and the first joining partner 11 and the second joining partner 12 are pressed together. In this case, the connecting means 21 is placed against those sides of the joining partners 11 and 12 which face one another, and is additionally compressed. Proceeding from the formation of the gas-tight region 5 there are two effects that are of significant importance for the further joining method.

Firstly, the two joining partners 11 and 12 are pressed together all the more greatly by increasing the pressure p62. In order to maintain the gas-tight region 5, the pressure p62 must be chosen to be greater than the pressure present in the gas-tight region 5 at the instant of sealing. The force with which the two joining partners 11 and 12 are pressed together can thus be set by way of the pressure p62. This can be effected substantially independently of the pressure p61 as long as the secondary condition that p62 is greater than p61 is complied with, which is tantamount to the differential pressure $\Delta p = p62 - p61$ being greater than zero. If the pressure p61 otherwise exceeded the pressure p62 by a specific absolute value determined by the adhesion of the film 4 to the stack 3 and the heating element 8, then there would be the risk of the film 4 being detached from the stack 3 and the gas-tight region 5 no longer being maintained.

Secondly, the differential pressure $\Delta p = p62 - p61$ can be used to set the contact force and thus the strength of the thermal contact between the stack 3 and the heating element 8, and also the contact force and thus the strength of the thermal contact between the heating element 8 and the housing element 71. These effects play a part during the heating and cooling of the stack 3.

In this method, the pressure p62 therefore acts on the joining partners 11, 12 and the connecting means 21. The force acting on the heating element 8 is determined, however, by the differential pressure Δp=p62−p61, that is to say by a pressure which in practice is chosen to be significantly lower than the maximum value of p62. As a result, the mechanical stresses occurring in the heating element 8 are also reduced, and in association with this there is the risk of warpage or fracture.

For the initial heating and/or for the later further heat treatment of the stack 3 with the aid of the heating element 8 it is advantageous if the latter is not cooled by the housing element 71, that is to say if there is a poor thermal contact between the heating element 8 and the housing element 71, which means that Δp=p62−p61 is set to a small positive value. Although the thermal coupling between the stack 3 and the heating element 8 is also reduced in this case, the heating rate remains sufficient on account of the low mass and heat capacity of the stack 3.

As a result, the thermal coupling between the heating element 8 and the first housing element 71 decreases and in association with this so does the dissipation of heat of the heating element 8 by the first housing element 71 during the subsequent heat treatment process, which facilitates the heating of the stack 3. In this case, it is advantageous if the heating element 8 has a low heat capacity, such that it can be heated rapidly. The heat capacity of the heating element 8 need not but can be chosen depending on the type of joining partners 11, 12 of the stack 3. For the case where the stack 3 comprises a metalized ceramic substrate, but not a thick metal plate, such as is used, for example, as a baseplate for a power semiconductor module, then the heat capacity of the stack 3 relative to the base area of the ceramic substrate can be e.g. in the range of 0.25 J/(K·cm$^2$) to 1.4 J/(K·cm$^2$). In this case, the heat capacity of the heating element 8 relative to the base area of the ceramic substrate can be e.g. in the range of 0.5 J/(K·cm$^2$) to 5 J/(K·cm$^2$), and the heating power of the heating element 8, likewise relative to the base area of the ceramic substrate, can be e.g. in the range of 5 W/cm$^2$ to 50 W/cm$^2$. These ranges of values can be used, in each case independently of one another, in all configurations of the invention. A "thick metal plate" in the sense of the above definition is considered to be a metal plate whose thickness is greater than or equal to 2.5 mm. Moreover, the base area of a ceramic substrate is understood to mean the area of that side of the ceramic lamina of the ceramic substrate which has the largest area.

As can be gathered from FIG. 1C, the connecting means 21 is heated indirectly via the first joining partner 11, that is to say that the heat generated in the heating element 8 is forwarded via the first joining partner 11 to the connecting means 21 and also to the second joining partner 12.

If the connecting means 21 is a solder, the heat emitted by the heating element 8 and/or the heating duration are/is set such that the solder melts and a soldering connection between the joining partners 11 and 12 arises. For this purpose, each of the joining partners 11, 12 has a metallization on its side facing the respective other joining partner 12, 11.

Optionally, before the gas-tight region 5 arises, at least the pressure p61 and optionally at the same time also p62 can be reduced shortly before, during or after the melting of the solder by evacuation in order to remove possible air inclusions from the connecting means 21 to the greatest possible extent, and thus to achieve soldering that is as free of shrink holes as possible.

After the melting and the increase in the differential pressure Δp for pressing the joining partner 12 onto the joining partner 11, the solder solidifies at a high temperature T of the connecting means 21, which is above the melting point of the solder, which stems from the fact that the liquid solder alloys with one or more metals from the metallization of one or both joining partners 11, 12 (diffusion soldering). By way of example, the solder can be a tin-containing solder, and the metallizations of the joining partners 11, 12 can in each case contain copper and/or silver or consist of copper and/or silver. After the melting of the solder, copper and/or silver diffuse(s) from the metallizations into the solder and together with the tin contained therein form(s) one or more high-strength intermetallic copper- and/or silver-tin phases having a high melting point. Of these intermetallic copper-tin phases, the intermetallic phase Cu6Sn5 has the lowest melting point with 415° C., followed by the phases Ag3Sn with 480° C. and Cu3Sn with a melting point of 676° C.

The solder and the in-diffused metal thus give rise to a strong connecting layer that cohesively connects the joining partners 11 and 12. It is advantageous for the strength of the connecting layer if the diffusion of the metal from the metallizations of the joining partners 11, 12 covers the solder as completely as possible. This can advantageously be achieved when the liquid solder forms a thin layer, since the required diffusion depth is then small.

After sufficient formation of strong bridges that continuously connect the joining partners 11 and 12 in the connecting means 21, the latter is slowly cooled further until it solidifies, such that there is a strong permanent cohesive connection between the first joining partner 11 and the second joining partner 12.

A solder can, for example, be inserted as a thin preformed solder lamina (so-called "preform" solder) between the joining partners 11 and 12 or be applied as solder paste to one or both joining partners 11 and 12. The solder can also be applied as a thin surface layer to an arbitrary one of the joining partners 11, 12 or to both joining partners 11, 12. A preformed solder lamina can have, for example, a thickness of less than or equal to 30 μm. The layer thickness of the solder layer applied to only one of the joining partners 11, 12 or the total thickness of the two solder layers applied to the joining partners 11, 12 can in this case be 5 μm to 30 μm, or e.g. 5 μm to 15 μm.

For cooling purposes, it is possible to reduce or interrupt the supply of heat from the heating element 8 toward the stack 3. In the simplest case, the heating element 8 can simply be switched off for this purpose. The heat of the two joining partners 11, 12 and of the connecting means 21 can then flow away via the heating element 8 toward the first housing element 71. In this case, the first housing element 71 acts as a heat sink. As an alternative thereto, the heating operation of the heating element 8 can indeed be maintained, but slowly restricted in order to ensure a slow and reduced build-up of thermo-mechanical stresses before the heating element 8 is finally switched off.

Moreover, for the purpose of cooling the stack 3, it is possible to increase the differential pressure Δp=p62−p61 in comparison with the heating phase, such that the stack 3 and the heating element 8 are pressed against the housing element 71, which then acts as a heat sink.

If the connecting means 21 is a sinterable paste, a sinterable film, a sinterable pre-coated and then dried layer or an adhesive, the connecting means 21 is heated until it is sufficiently sintered and cured, such that there is a strong, highly compressed and/or cohesive connection between the first joining partner 11 and the second joining partner 12.

The connecting means 21 embodied as a sinterable film can be inserted for example as a preformed ("green", i.e. unsintered) film lamina between the joining partners 11 and 12. If the connecting means 21 is a sinterable paste or an adhesive, the connecting means 21 can be applied to one or both joining partners 11 and 12. The sinterable paste is preferably pre-dried or pre-sintered without pressure.

Independently of the type of connecting means 21, the reactor 7 is opened after the heat treatment process and the stack 3, in which the first joining partner 11 and the second joining partner 12 are now strongly and cohesively connected to one another with the aid of the connecting means 21 interposed between the joining partners 11 and 12, is removed from the pressure chamber 6. A cooling phase following the heat treatment process can take place wholly or partly in the still closed reactor 7, or else after the stack 3 has been removed from the pressure chamber 6.

In this and likewise in the other exemplary embodiments, the positions of the orifice regions at which the pressure connections 81 and 82 lead into the pressure chamber 6 are only illustrated schematically. In order to prevent these orifice regions from being closed off by the film 4 in the case of unfavorable pressure ratios, the positions of the orifice regions can be chosen depending on the respective configuration. Such orifice regions of the first pressure connection 81 can also be embodied such that they are formed circumferentially around the heating element 8 below the heating element 8, such that that edge of the lateral margin of the heating element 8 which faces the housing element 71 is situated freely in the orifice region and does not bear on the housing element 71.

Figure 2:
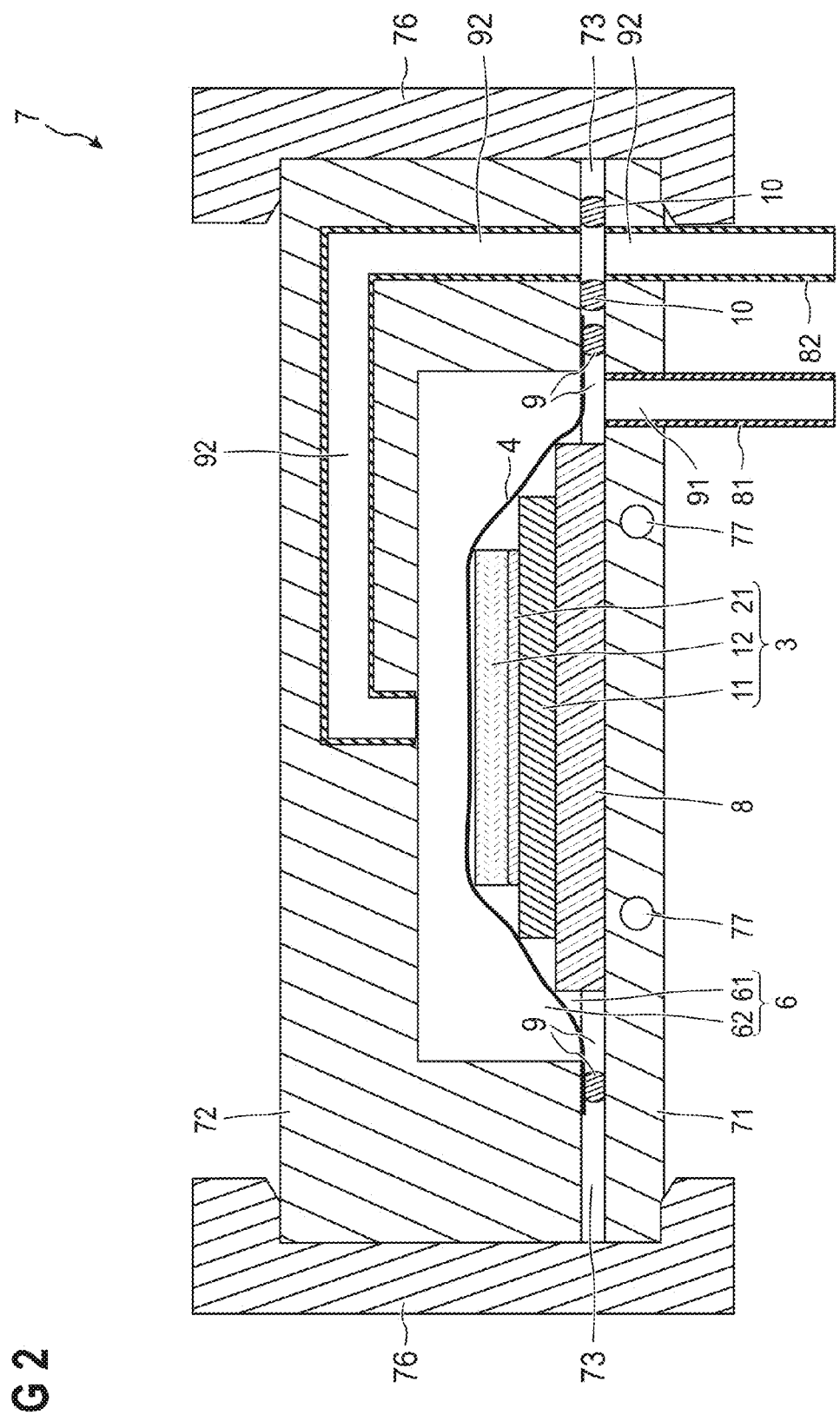
FIG. 2 shows a reactor that differs from the reactor in accordance with FIGS. 1A to 1C in that all pressure connection lines of the reactor are led out on the same side of the reactor.

The arrangement in accordance with FIG. 2 differs from the arrangement in accordance with FIGS. 1A to 1C in that the first pressure connection 81 and the second pressure connection 82 are situated on the same side of the reactor 7, which facilitates the connection of the required pressure lines to the reactor 7. For this purpose, in the exemplary embodiment shown, the second connecting line 92 runs across the gap 73. In the region of the gap 73, a ring-shaped seal 10 is provided between the housing elements 71 and 72. The seal 10 surrounds the orifice openings, at which the second connecting line 92 and the pressure connection 82 lead into the gap 73, in a ring-shaped manner and, when the reactor 7 is closed, seals them such that no pressure equalization between the second connecting line 92 and the second pressure connection 82, on the one hand, and the pressure chamber 6 and the atmosphere surrounding the reactor 7, on the other hand, can take place through the gap 73.

With the reactor 7 in accordance with FIG. 2, the joining method explained with reference to FIGS. 1A to 1C can be carried out in the same way.

In accordance with a further configuration shown in FIGS. 3A to 3D, a reactor 7 can be equipped with one or more spring elements 74 which wholly or partly thermally decouple the heating element 8 from the first housing element 71 if the differential pressure $\Delta p = p62 - p61$ between the pressure $p62$ in the second chamber region 62 and the pressure $p61$ in the first chamber region 61 is less than a specific absolute value. This makes it possible for the stack 3 comprising the joining partners 11, 12 and the connecting means 21 together with the heating element 8 to be thermally coupled or decoupled to the first housing element 71 in a manner dependent on the differential pressure $\Delta p$. For the rest, this arrangement is identical to the arrangement in accordance with FIG. 2. In particular, with this arrangement it is possible to carry out the same joining method already described in conjunction with FIGS. 1A to 1C and 2.

Figure 3B:
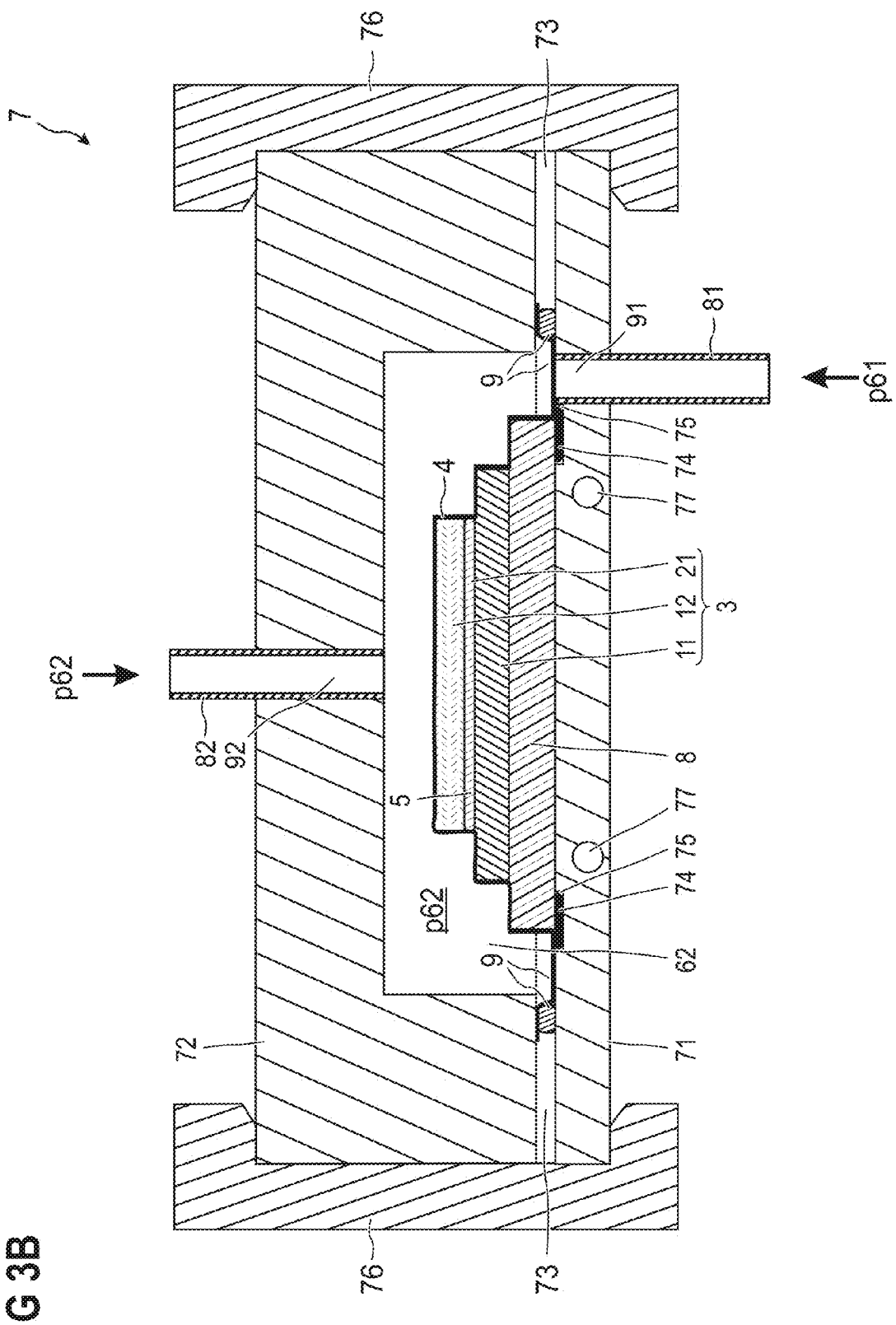
FIG. 3B shows a vertical section through the closed reactor in accordance with FIG. 3A, in which a suitable pressure is applied to the pressure chamber, such that the film is placed against the surface contour of the stack formed from the joining partners and the connecting means.

FIG. 3A shows the closed reactor 7 equipped with the stack 3. After a differential pressure $\Delta p = p62 - p61 > 0$ has been applied, the film 4 is placed against the stack 3 and follows the surface contour thereof, as explained above. Given a sufficiently high differential pressure $\Delta p$, in this case the heating element 8 together with the stack 3 is pressed in the direction of the first housing element 71 by the differential pressure $\Delta p$ acting on the film 4, wherein the spring elements 74 are pressed into corresponding receptacle regions 75 of the first housing element 71, which is shown as the result in FIG. 3B.

Figure 3C:
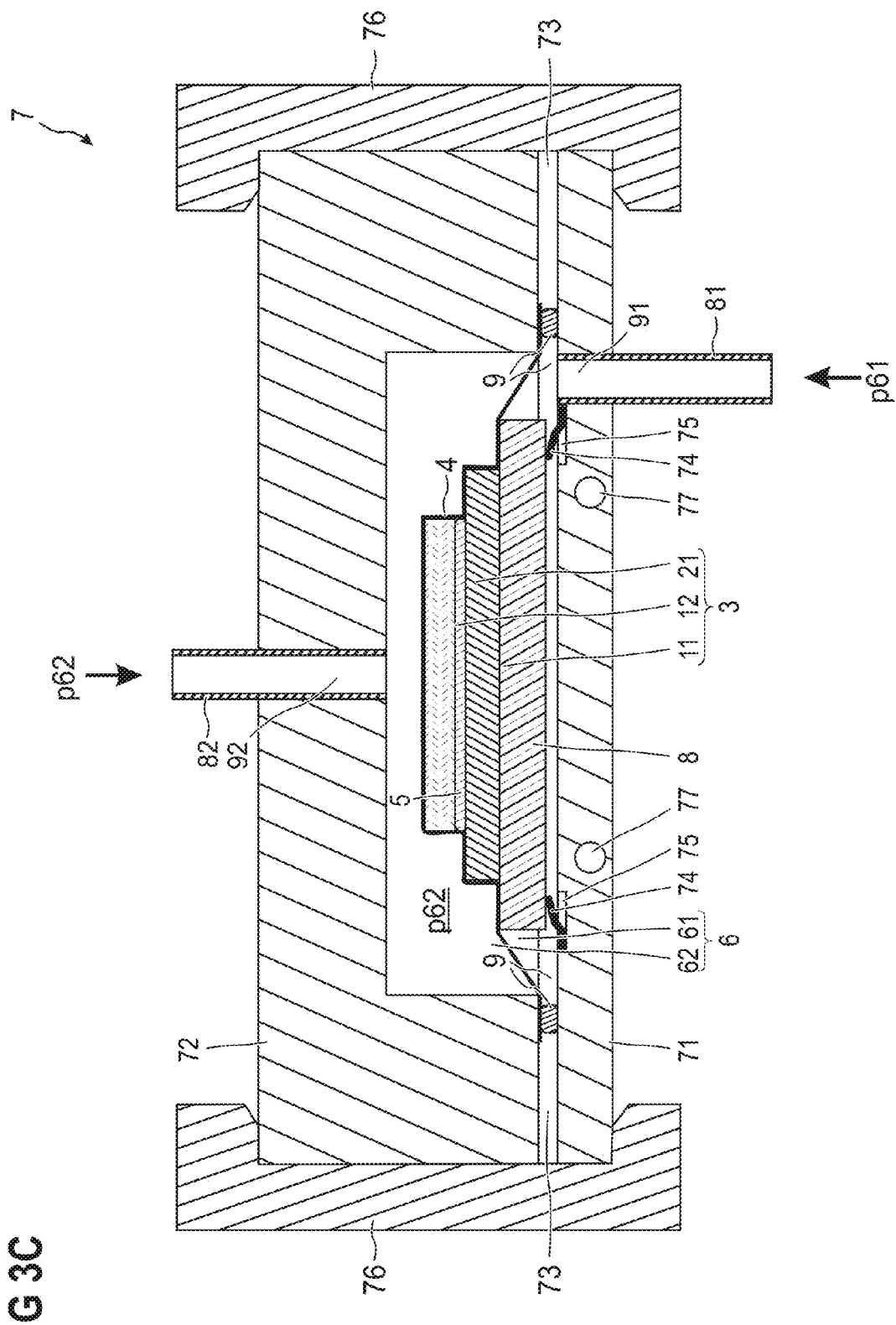
FIG. 3C shows a vertical section through the closed reactor in accordance with FIGS. 3A and 3B, in which the joining partner, the connecting means and a heating plate situated in the pressure chamber are thermally decoupled from the reactor housing.
Figure 3D:
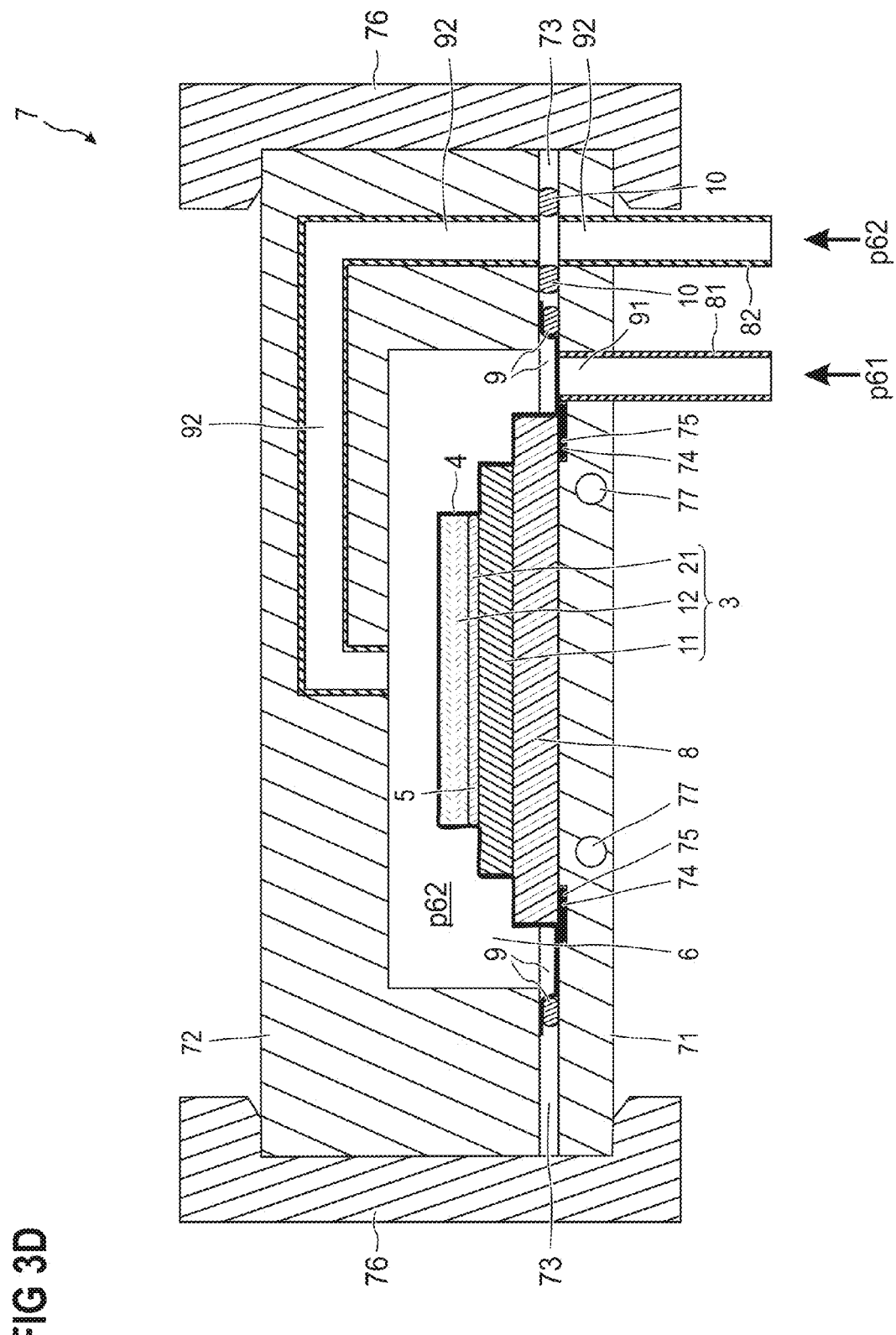
FIG. 3D shows a vertical section through the closed reactor in accordance with FIGS. 3A to 3C, in which the joining partner, the connecting means and a heating plate situated in the pressure chamber are thermally decoupled from the reactor housing.

Once the film 4 has then been sealed in a gas-tight fashion in the region 5 in which the connecting means 21 is situated and the connecting means 21 has been compressed with a further increase in the differential pressure $\Delta p$, the differential pressure $\Delta p$ can be reduced again to an extent such that the heating element 8 is wholly or partly thermally decoupled from the first housing element 71, by virtue of the fact that, by means of the spring elements 74, the heating element 8 is lifted away from the first housing element 71 and thus wholly or at least substantially thermally decoupled from the first housing element 71, which is shown as the result in FIG. 3C.

In this state decoupled thermally from the housing element 71, the connecting means 21 together with the joining partners 11, 12 can, as described above, be subjected to heat treatment and compressed/pressed/sintered with the aid of the excess pressure in the reactor 7. In order to cool the stack 3 after the heat treatment, the differential pressure $\Delta p$ can be increased again to a value at which the heating element 8 together with the stack 3 is pressed against the first housing element 71 on account of the differential pressure $\Delta p$ acting on the film 4, such that the stack 3 and the heating element 8 are in a good thermal contact with the first housing element 71, which then once again, as explained, acts as a heat sink. In this case, as already explained, the spring elements 74 are pressed into the respective receptacle regions 75, which is shown as the result in FIG. 3D. In order not to counteract the cooling, the heating element 8 can be switched off.

In the case of the connecting means 21 embodied as solder, the entire pressure chamber 6 can be firstly evacuated to a very low pressure of, for example, less than 50 hPa. The differential pressure $\Delta p$ is then increased by pressure being built up in the second chamber region 62 and by the maintenance of the very low pressure in the first chamber region 61, such that the film 4 is pressed onto the stack 3. Air inclusions in the solder layer are avoided as a result of the very low pressure. In this case, the differential pressure $\Delta p = p62 - p61$ is chosen with a magnitude such that a gas-tight region 5 is formed, in which the solder 21 is situated. The differential pressure $\Delta p$ is then reduced to an extent such that the spring elements 74 decouple the heating plate 8 from the first housing element 71. Afterward, the heating element 8 is heated, and at the latest when the solder has melted, the pressure $p62$ is increased, such that the joining partners 11 and 12 are pressed together. At the same time, it is also possible to increase the pressure $p61$, such that a very low differential pressure $\Delta p$ remains in order to avoid an excessively great thermal coupling between the heating element 8 and the first housing element 71. After the formation of sufficient intermetallic phases in the solder ("diffusion soldering"), which, as already explained, ensure a strong connection between the two joining partners 11 and 12, cooling can be effected by increasing the differential pressure, optionally after previously switching off the heating element 8. In order to monitor and control the required temperature profiles of the connecting means 21, it is possible—as in all other configurations of the invention—to use a temperature sensor that is thermally coupled to the connecting means 21 (not illustrated).

As an alternative or in addition thereto, compliance with a specific temporal temperature profile of the connecting means 21 can be set by implementing a specific process sequence with specific temporal profiles of the heating power of the heating element 8, of the pressure p62 and, if provided, of the pressure p61, with test stacks 3 ("dummies") and assessing the profile based on the result obtained. Sufficiently good results can then be reproduced in the real production process on the basis of an identical temporal temperature and pressure profile. A prerequisite in this case is for the test stacks 3 to be identical or at least comparable to the stacks 3 processed in the real production process.

In order to be able to ascertain the attained maximum temperatures afterward, at least one of the joining partners 11, 12 or a dummy can be marked with an irreversibly thermochromic color which, upon a limiting temperature dependent on the relevant color being attained, assumes a specific color and maintains it even when the temperature of the relevant joining partner falls below the limiting temperature again.

In order to set a defined profile of the cooling, the thermal coupling between the heating element 8 and the stack 3, on the one hand, and the first housing element 71, on the other hand, can be alternately increased and reduced by the differential pressure $\Delta p$ being alternately increased and reduced.

Figure 4:
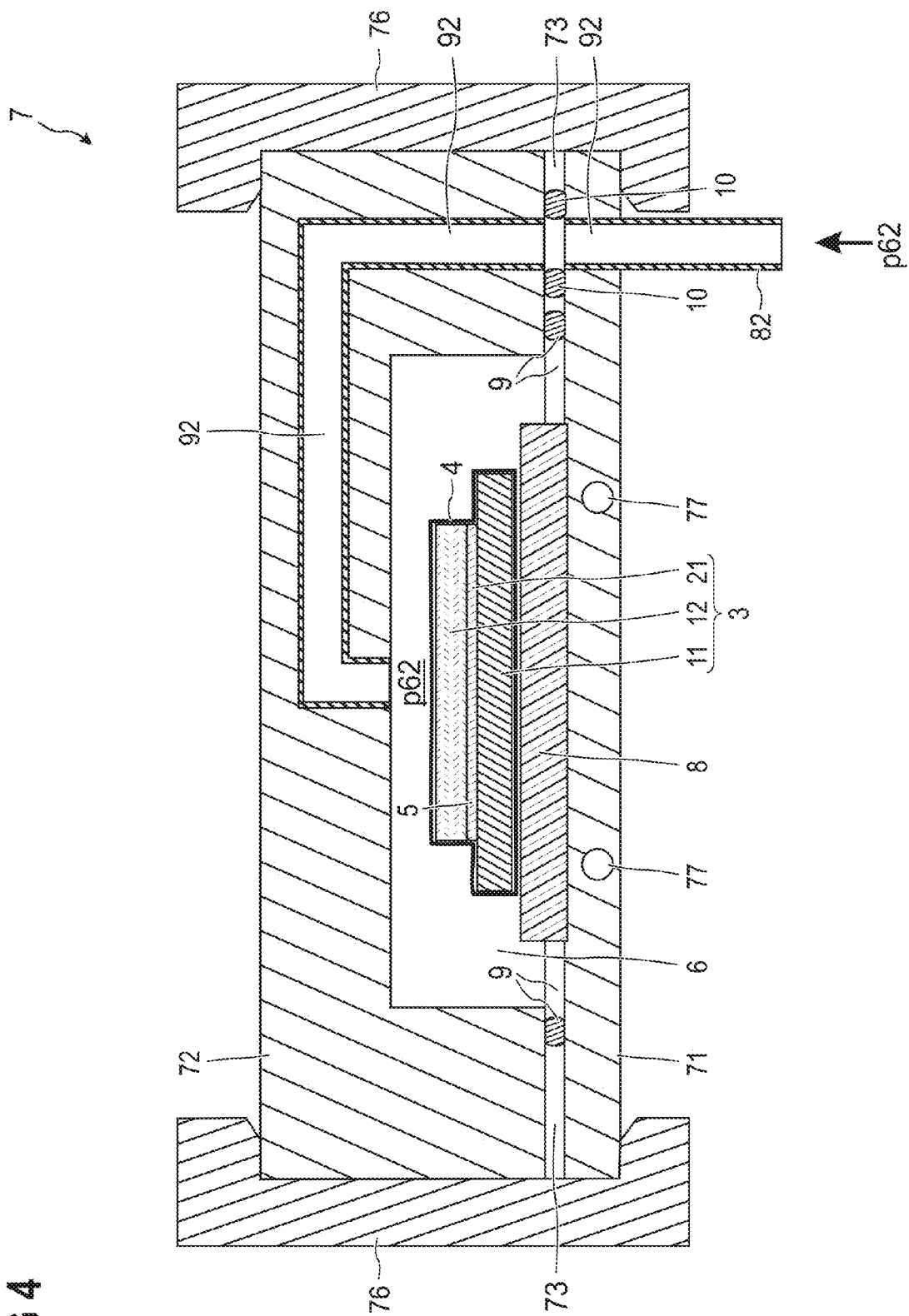
FIG. 4 shows a vertical section through an arrangement of a reactor equipped with two joining partners and a connecting means, which differs from the arrangement in accordance with FIG. 2 in that the film is embodied as a pouch which is closed in a gas-tight fashion and in which the two joining partners and the connecting means are arranged.

In accordance with a different configuration shown in FIG. 4, a reactor 7 is used, which differs from the reactor 7 explained with reference to FIG. 2 in that no first pressure connection 81 is present. Alternatively, however, it is possible to use any pressure reactor which is able to apply an increased pressure to a pressure chamber 6.

In the arrangement in accordance with FIG. 4, a film 4 is once again provided as a sealing means, but the film 4, in a departure from the arrangements in accordance with FIGS. 1A to 1C, 2 and 3A to 3D is embodied as a gas-tight, closed pouch in which the first joining partner 11, the second joining partner 12 and the connecting means 21 are arranged with the connecting means 21 interposed between the first joining partner 11 and the second joining partner 12. Optionally, the film pouch 4 with the inserted stack 3 is evacuated and welded in a gas-tight fashion in the evacuated state. Consequently, in this configuration, too, the connecting means 21 is situated in a gas-tight region 5 provided by the interior of the film pouch 4.

The film pouch 4 containing the joining partners 11 and 12 and the connecting means 21 is inserted into the pressure chamber 6 of the reactor 7. If a pressure p62 is applied to the pressure chamber 6 after the reactor 7 has been closed, then the joining partners 11, 12 are pressed against the connecting means 21. In this case, the connecting means 21 is compressed and additionally placed against those sides of the joining partners 11 and 12 which face one another.

Afterward, the connecting means 21 can be heated and subjected to heat treatment with the aid of the heating element 8, as explained above. In this case, too, the connecting means 21 can be, for example, a solder, a sinterable paste or an adhesive. In contrast to the configurations in accordance with FIGS. 1A to 1C, 2 and 3A to 3D, however, a change in the pressure ratios in the pressure chamber 6 does not bring about a change in the thermal coupling between the heating element 8 and the first housing element 71. Rather, in this configuration, a specific temperature profile to be complied with during the heat treatment process and the subsequent cooling is substantially controlled by the regulation of the heating power of the heating element 8, wherein the heating element 8 can also be switched off or alternately switched off and on repeatedly. The heating element 8 is continuously in sufficiently good thermal contact with the first housing element 71. The heating element 8 can, in particular, be fixedly connected to the first housing element 71. As also explained with reference to FIGS. 6A, 6B and 7 to 9 below, the heating element 8 can optionally be fixed to the first housing element 71 by means of a thermal insulator 80, for example a ceramic having poor thermal conductivity. The stack 3 can thus be heated with commensurate power. Likewise, however, cooling toward the first housing element 71 is also still possible in a sufficiently short time if the heat capacity of the stack 3 and of the heating element 8 is kept low.

Figure 5:
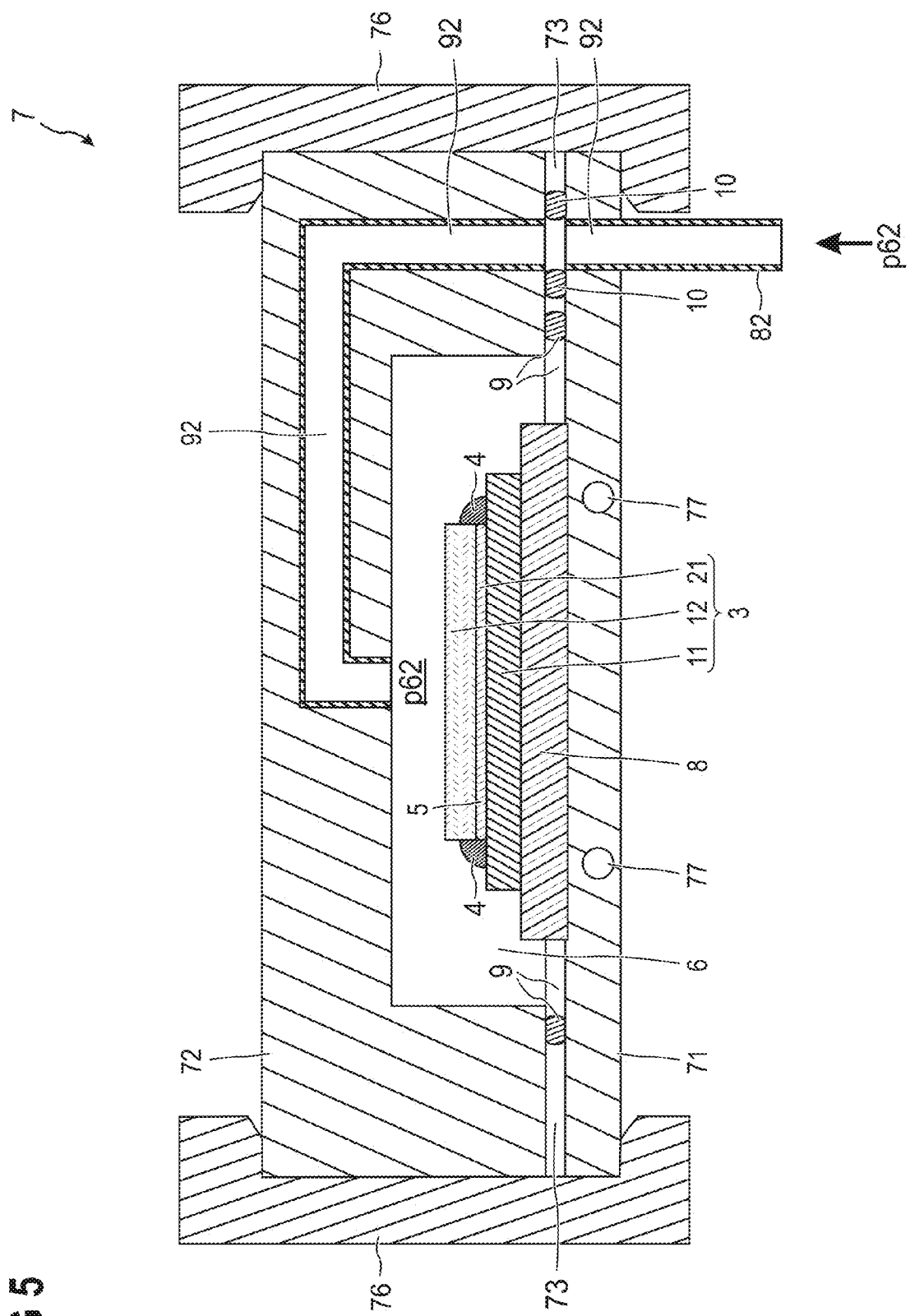
FIG. 5 shows a vertical section through an arrangement of a reactor equipped with two joining partners and a connecting means, which differs from the arrangements in accordance with FIGS. 2 and 4 in that instead of a film a sealing bead is used as sealing means.

In accordance with a further configuration shown in FIG. 5, the sealing means 4 is embodied as a sealing bead. The sealing bead is embodied as a closed ring covering the edges of the connecting means 21 that are exposed at the gap between the first joining partner 11 and the second joining partner 12, such that a gas-tight region 5 arises between the first joining partner 11, the second joining partner 12 and the sealing bead 4, the connecting means 21 being arranged in the gas-tight region 5. The sealing bead 4 can be produced by applying a soft material, for example silicone (polysiloxane), as a closed ring that seals the gap between the first joining partner 11 and the second joining partner 12, the ring subsequently being cured. The curing can be effected for example by UV irradiation, by heat treatment or by the supply of moisture, for example in the form of an increase in the air humidity. These measures can also be used in combination with one another. For the purpose of applying the soft material, the first joining partner 11, the second joining partner 12 and the connecting means 21 are preferably situated outside the pressure chamber 6. The subsequent curing can optionally be effected outside or in the pressure chamber 6.

After curing, the stack 3 is inserted into the pressure chamber 6, provided that it is not already situated there for the purpose of curing the soft material. After the reactor 7 has been closed, a pressure p62 is applied to the pressure chamber 6, and presses the first joining partner 11 and the second joining partner 12 onto the connecting means 21. After the pressure p62 has been increased, the connecting means 21 is subjected to heat treatment and then cooled, as explained above with reference to FIG. 4. A strong cohesive connection between the first joining partner 11 and the second joining partner 12 is again present as a result. The stack 3 together with the sealing bead 4 can then be removed from the pressure chamber 6. The sealing bead 4 can either be removed from the stack 3 or else remain on the latter, for example if the stack 3 is incorporated in a housing of a power semiconductor module, which will be explained later with regard to FIG. 13C.

The reactor 7 in accordance with FIG. 5 is identical to the reactor 7 explained with reference to FIG. 4. In principle, however, it is also possible to use any other reactor that is able to apply an increased pressure to the pressure chamber 6.

Figure 6A:
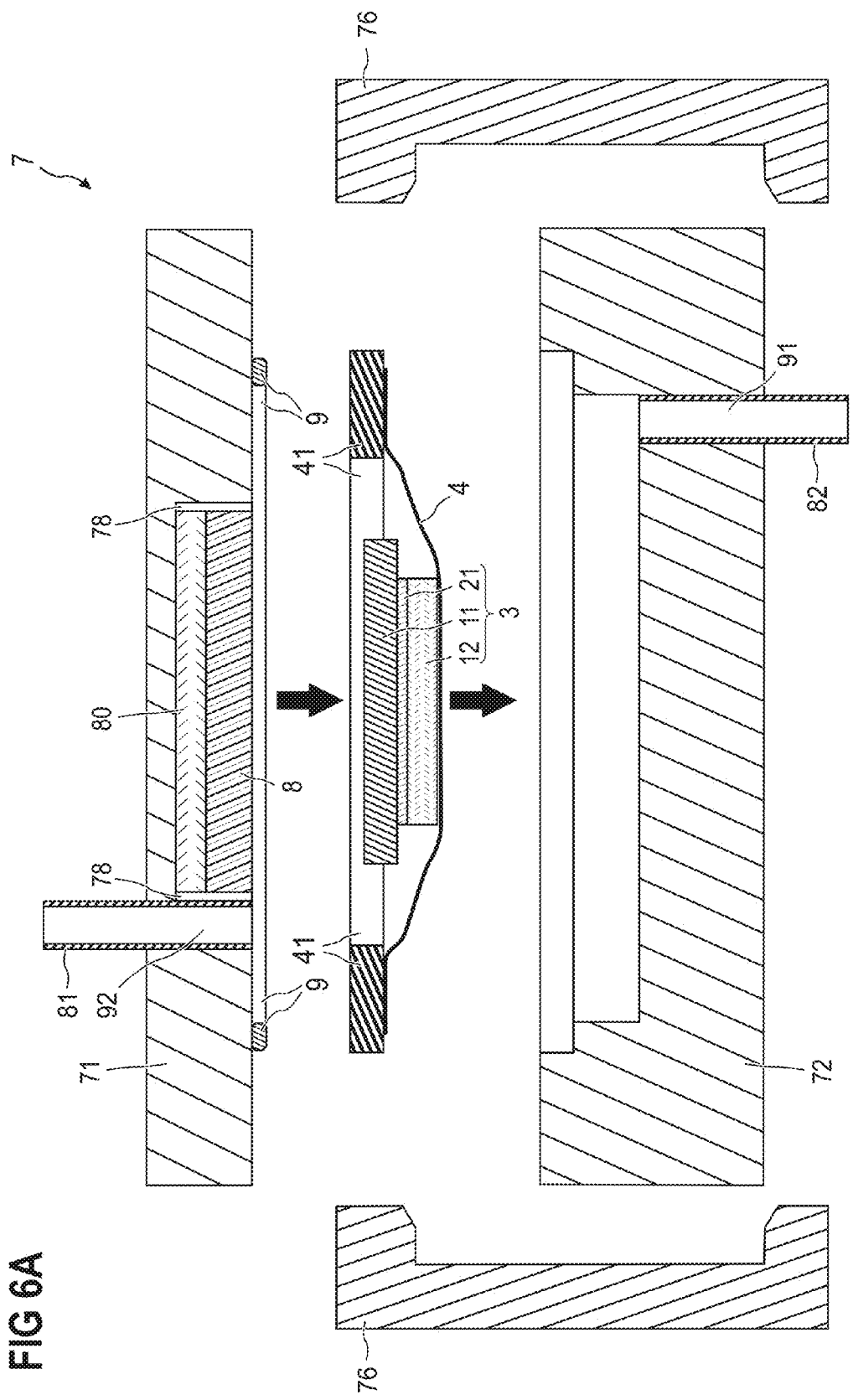
FIG. 6A shows a vertical section through an arrangement with a reactor in which the heating element is thermally decoupled from the housing of the reactor by means of a plate having low thermal conductivity, and in which a film is used as sealing means, the joining partners and the connecting means bearing on said film.
Figure 6B:
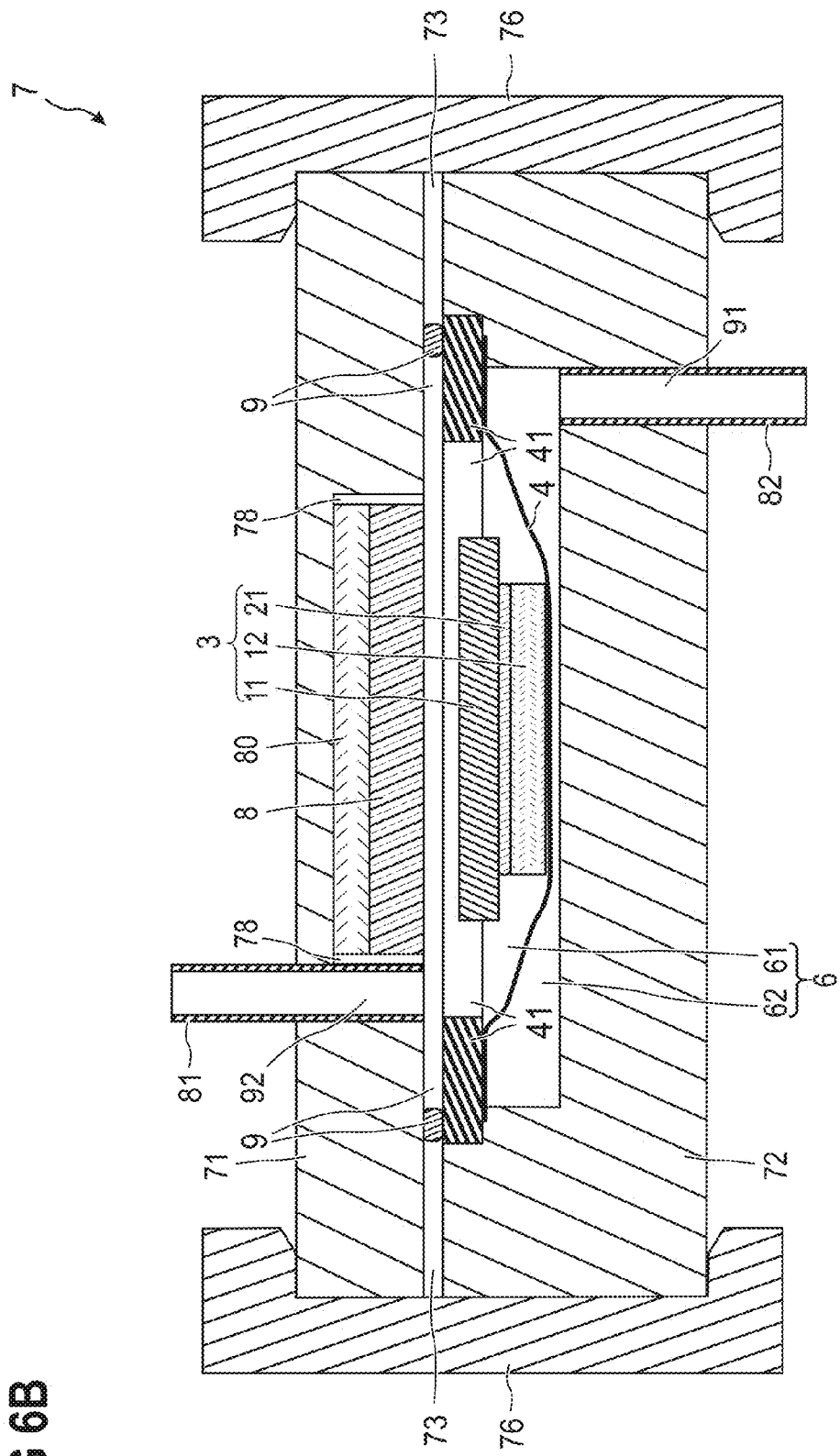
FIG. 6B shows the arrangement in accordance with FIG. 6A after the reactor has been closed.
Figure 6C:
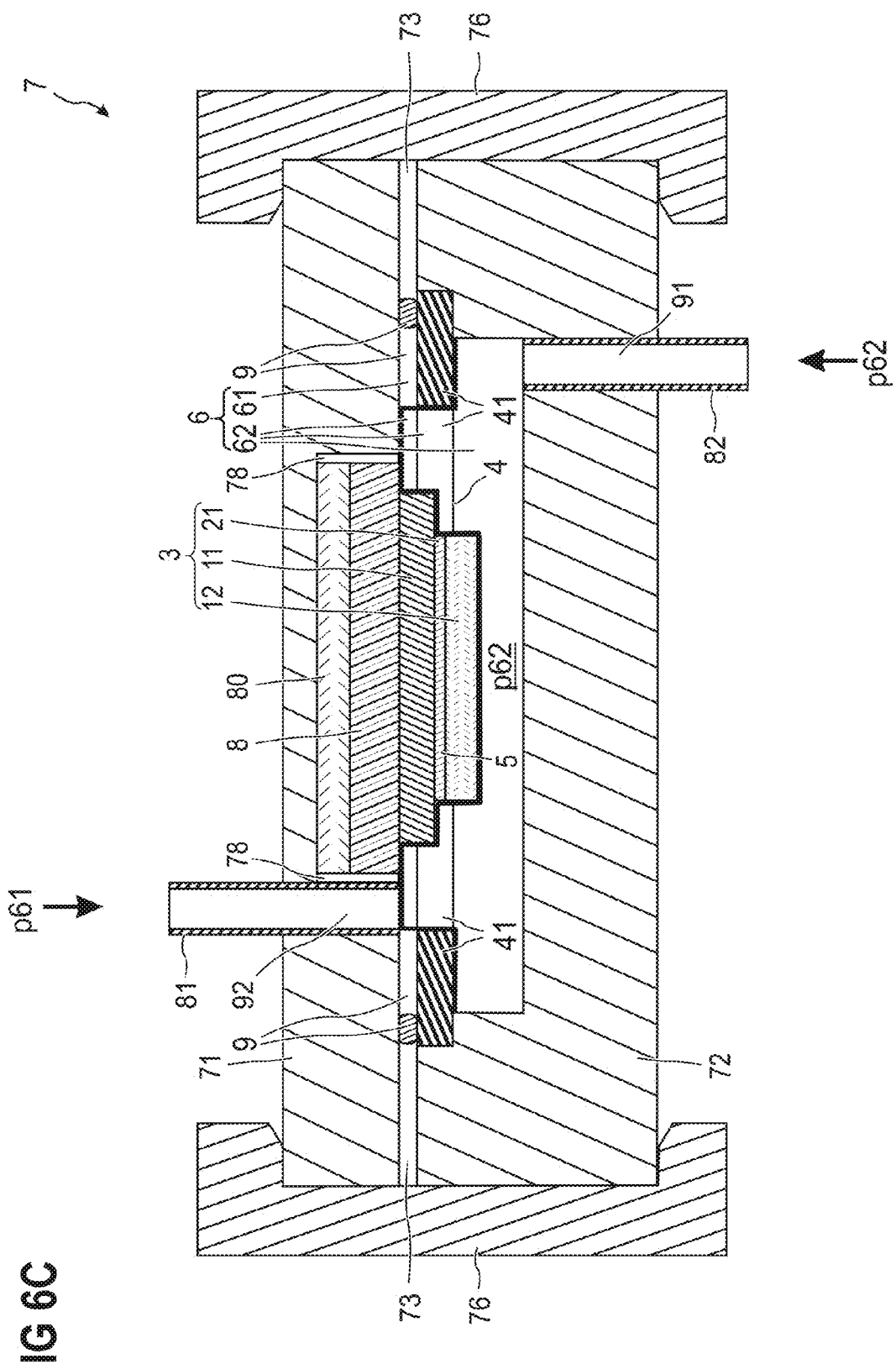
FIG. 6C shows a vertical section through the closed reactor in accordance with FIG. 6B, in which a suitable pressure is applied to the pressure chamber, such that the film is placed against the surface contour of the stack formed from the joining partners and the connecting means.

In accordance with a further configuration shown in FIGS. 6A to 6C, the second housing element 72, unlike in the case of the reactors 7 explained above, forms the underside of the pressure chamber 6 relative to the gravitational force.

The sealing means 4 is once again embodied as a film in this embodiment, which is fixed to a carrier 41. The second joining partner 12, the connecting means 21 and the first joining partner 11 can then be placed onto the film 4 in the form of a stack 3, individually one after another or in the form of partial stacks. Before or after this placement, the carrier 41 is inserted into the second housing element 72. The reactor 7 is then closed, which is shown as the result in FIG. 6B.

In the closed state of the reactor 7, the film 4 subdivides the pressure chamber 6 into a first chamber region 61 and a second chamber region 62. The film 4 prevents a gas exchange between the first chamber region 61 and the second chamber region 62 from taking place within the pressure chamber 6. The heating element 8 is arranged above the stack 3 and fixedly connected to the second housing element 72. As is shown in FIG. 6B, the heating element 8 can be inserted into a corresponding depression of the second housing element 72.

In order to prevent the heating element 8 from being cooled by the housing 71, 72 of the reactor 7 in the heating phases, that is to say in phases in which it is brought to a high temperature, optionally a thermal insulator 80 can be introduced between the heating element 8 and the housing 71, 72, such that the heating element 8 is thermally decoupled from the housing 71, 72. The thermal insulator 80 has a lower thermal conductivity than the housing 71, 72. The thermal conductivity of the thermal insulator 80 can be chosen to be, for example, less than or equal to 30 W/(m·K), or less than or equal to 2.5 W/(m·K). The thermal insulator 80 can, for example, comprise ceramic or consist of ceramic. Suitable ceramics include e.g. oxide ceramics such as aluminum oxide (Al2O3) having a high proportion of glass, or zirconium oxide (ZrO2), but also any other materials having low thermal conductivity, such as e.g. a glass known by the name Zerodur®. Magnesium or yttrium can optionally be admixed with the zirconium oxide in order to increase its fracture toughness (magnesium-stabilized zirconium oxide or yttrium-stabilized zirconium oxide).

In accordance with a further option, a spacer region 78 is provided between the heating element 8 and the housing 71, 72, the spacer region 78 likewise serving for thermal decoupling but primarily for accommodating different expansion between the heating element 8 and housing 71, 72. The spacer regions 78 can be filled for example with gas, e.g. air, or with a thermal insulator 80 having a lower thermal conductivity than the housing 71, 72. In this case, the spacer region 78 can be embodied as a closed ring that laterally completely encloses the thermal insulator 80.

The above-described thermal insulator 80, optionally in conjunction with the spacer region 78, can also be provided in all other reactors 7 that can be used in conjunction with the present invention, if the joining process does not require cooling of the heating element 8 by the reactor housing 71, 72.

As is shown in FIG. 6B, the inherent weight of the stack 3 acts on the film 4, as a result of which the film 4 is pulled somewhat downward, such that the stack 3 is spaced apart from the heating element 8. Consequently, there is virtually no thermal coupling between the stack 3 and the heating element 8.

If a differential pressure $\Delta p = p62 - p61 > 0$ is then applied to the film 8 and if the differential pressure exceeds a specific value, then the film 4 is pressed against the stack 3 and substantially follows the surface contour or topology thereof as is shown in FIG. 6C. In this case, as in the case of the exemplary embodiments explained above, the film 4 seals the gap between the first joining partner 11 and the second joining partner 12, in which gap the connecting means 21 is situated, in a gas-tight fashion. As a result, a gas-tight region 5 in which the connecting means 21 is arranged arises between the first joining partner 11, the second joining partner 12 and the film 4. The differential pressure $\Delta p = p62 - p61$ required for placing the film 4 against the stack 3 can in this case be high enough such that the stack 3 is simultaneously pressed against the heating element 8.

If the pressure p62 is then increased further after the formation of the gas-tight region 5, the first joining partner 11 and the second joining partner 12 are pressed against the connecting means 21 to an even greater extent. Moreover, the stack 3 is pressed against the heating element 8, such that there is now a good thermal contact between the stack 3 and the heating element 8.

The heating element 8 can be heated optionally before, at the same time as, but also only after, the formation of the thermal contact, in order to subject the connecting means 21 together with the first and second joining partners 11, 12 to heat treatment, as described above. In this case, too, the connecting means 21 can be a solder, a sinterable paste or film, or an adhesive.

After the heat treatment step, the stack 3 can be cooled in accordance with a defined temperature profile as explained in the previous embodiments. For this purpose, the heating element 8 can be switched off or its power can be reduced in accordance with a predefined profile. In addition or as an alternative thereto, the differential pressure $\Delta p = p62 - p61$ can be reduced to an extent such that the stack 3 is pulled away by its inherent weight from the heating element 8 and thereby thermally decoupled from the heating element 8. Optionally, the pressure chamber 6 can be dimensioned such that in this case the stack 3 together with the film 4 situated below it bears on the second housing element 72 and is cooled by the latter.

If the temperature of the heating element 8, which is cooled by the housing 71, 72 when a thermal insulator 80 is not provided, or which is cooled at least slightly by the housing 71, 72 when a thermal insulator 80 is not present, is lower than the temperature of the second joining partner 12, the stack 3 can also be cooled by being brought into thermal contact with the heating element 8, which can in turn be effected by means of a sufficient increase in the differential pressure $\Delta p = p62 - p61$.

In accordance with a further configuration of the invention, as shown in FIG. 7, the orifice opening at which the first pressure connection 81 leads into the pressure chamber 6 can be covered with a protective cover 79, which prevents the sealing means 4 embodied as a film from penetrating into the first connecting line 91 if the differential pressure $\Delta p = p62 - p61$ is greater than zero. Corresponding protective covers can be provided in all configurations of the invention, in which case they can manifest their protective effect when the connecting means 4 used is embodied as a film.

FIG. 7 likewise shows yet another option, already explained with reference to FIGS. 6A to 6C, in accordance with which a thermal insulator 80 can be arranged between the heating element 8 and the housing 71, 72 of the reactor 7. Apart from the fact that the reactor 7 in accordance with FIG. 7 differs from the reactor 7 in accordance with FIGS. 6A to 6C in that the heating element 8 and the thermal insulator 80 are not situated above but rather below the stack 3 relative to the gravitational force, and that the first chamber region 61 is not situated above but rather below the second chamber region 62 relative to the gravitational force, the joining process (in the case of the present invention the latter generally includes the heat treatment step and, when a film is used as sealing means 4, the previous production of a gas-tight region 5 with the aid of the film) and the subsequent cooling process can be effected in the same way, wherein a reduction of the thermal coupling between the stack 3 and the heating element 8 is replaced by a reduction of the differential pressure $\Delta p = p62 - p61$, and wherein an increase in the thermal coupling between the stack 3 and the heating element 8 is replaced by an increase in the differential pressure $\Delta p = p62 - p61$.

FIG. 7 additionally also elucidates, in a manner representative of all configurations of the invention, the fact that the gap 73, for increasing the sealing effect, can also be sealed with two or more seals 9' instead of with one seal 9, each of which seals 9, 9' is situated in the gap 73 and surrounds the pressure chamber 6 in a ring-shaped manner when the reactor 7 is closed.

As is furthermore explained with reference to FIG. 8, a carrier 30 having good thermal conductivity can be used for the joining process. The carrier 30 is equipped outside the reactor 7 with the stack 3 comprising all joining partners 11, 12 and connecting means 21 and in this equipped state is then brought into the pressure chamber 6, where the joining process and optionally also the subsequent cooling process is/are carried out. As described above, a film is provided as sealing means 4. The reactor 7 as such is identical to the reactor 7 in accordance with FIG. 7. The heat treatment and the subsequent cooling of the stack 3 can be effected in accordance with one of the methods explained above with reference to FIGS. 1A to 1C, 2, 3A to 3D and 7. On account of the good thermal conductivity of the carrier 30, the latter enables a good thermal coupling between the heating element 8 and the stack 3. The thermally conductive carrier 30 can have, for example, a thermal conductivity of at least 15 W/(m·K).

FIG. 9 shows an exemplary embodiment in which the sealing means 4 is embodied as a film, which, besides its function as a sealing means, simultaneously fulfills the function of a transport tape. In this case, the stack 3 comprising all joining partners 11, 12 and connecting means 21 is positioned on the film 4 outside the pressure chamber 6 and then introduced into the pressure chamber 6 using the film 4 as a transport tape, which is illustrated by an arrow in FIG. 9. After the pressure chamber 6 has been closed, the joining process and the subsequent cooling process can be carried out as in the method explained with reference to FIGS. 6A to 6C.

By using the film 4 as a transport tape, it is also possible for a plurality of stacks 3 to be placed onto the film 4 one after the other at a sufficient distance in the transport direction of the film 4 and to be introduced temporally successively into the pressure chamber 6 and to be connected there with the aid of the joining process explained in FIGS. 6A to 6C and then to be cooled. A frame 41 for mounting the film 4, which frame was explained with reference to FIGS. 6A to 6C and is inserted into the reactor 7, can be omitted, however, since the film 4 is clamped and thereby held in the gap 73 between the housing elements 71 and 72 after the reactor 7 has been closed.

After the joining process and the optional cooling process, the pressure chamber 6 can be opened and the finished composite comprising all joining partners 11, 12 and connecting means 21 can be conveyed out of the pressure chamber 6 during a transport step in which the film 4 is used as a transport tape. Optionally, during this transport step, a stack 3 already situated on the film 4 and comprising joining partners 11, 12 and connecting means 21 yet to be joined can be introduced into the pressure chamber 6, joined and cooled, etc. In this way, in a continuous method, a plurality of stacks 3 can correspondingly also be placed on the film 4 one behind another in the transport direction of the film 4 and introduced one after the other into the pressure chamber 6, joined, cooled and led out of the pressure chamber 6.

As was explained above, a sealing means 4 configured as a film can be used to subdivide the pressure chamber 6 into two chamber regions 61 and 62 separated by the film in a gas-tight manner, to which chamber regions different gas pressures p61 and p62, respectively, can be applied via corresponding pressure connections 81 and 82, respectively. In the methods in which the sealing means 4 is embodied as a film pouch (FIG. 4) or as a sealing bead (FIG. 5), however, it is sufficient if the pressure in the pressure chamber 6 is applied from outside with only one pressure.

As an example of this, FIG. 10 shows a reactor 7 having only a single pressure connection 82, via which a gas pressure p62 can be applied to the pressure chamber 6. In principle, it is possible to perform joining processes in which the sealing means 4 is embodied as a film pouch (FIG. 4) or as a sealing bead (FIG. 5), the film pouch with the stack 3 situated therein or the stack 3 provided with the sealing bead in any arbitrary reactor 7. In the case of reactors 7 having two or more pressure connections 81, 82, all but one can be closed off. The process pressure p62 can then be supplied via the remaining pressure connection.

As is likewise shown by way of example in FIG. 10, two or more stacks 3 can also be processed in the pressure chamber 6 during a common joining process and then optionally cooled. Film pouches or sealing beads can be used as a sealing means 4 in the case of the individual stacks 3, as already explained. In this case, when there are different stacks 3, only film pouches, only sealing beads or, as is shown in FIG. 10, both film pouches and sealing beads can be used.

FIG. 10 likewise reveals that a dedicated heating element 8 can be provided for each of the stacks 3 to be processed. As an alternative thereto, two or more stacks 3 could also be subjected to heat treatment on a common heating element 8.

In all of the embodiments explained above, a first and a second joining partner 11, 12 are connected using a connecting means 21 situated between them, wherein the first joining partner 11, the connecting means 21 and the second joining partner 12 are arranged one above another to form a stack 3. Likewise, however, a stack 3 in all methods explained can also comprise three or more joining partners to be connected to one another and a corresponding number of connecting means.

Figure 11:
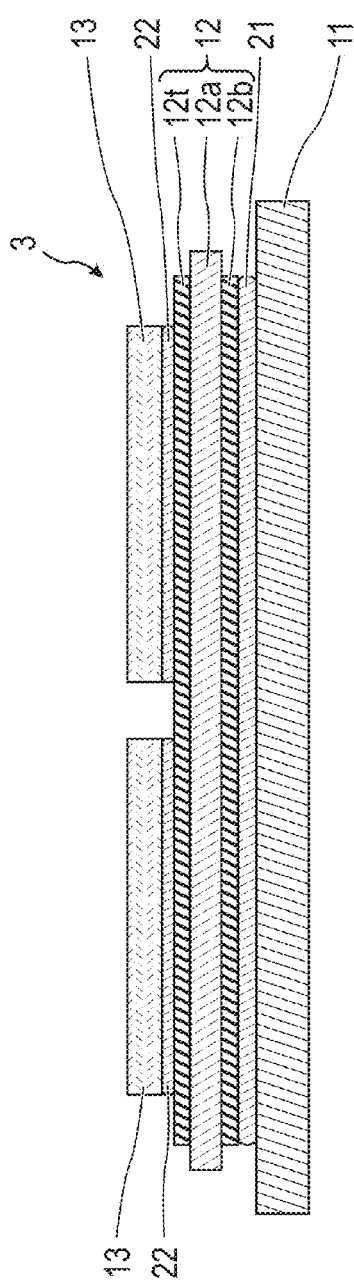
FIG. 11 shows a vertical section through an arrangement comprising more than two joining partners to be connected to one another.

As an example of this, FIG. 11 shows a stack 3 in which a first joining partner 11, a second joining partner 12 and two third joining partners 13 are arranged successively. A first connecting means 21 is situated between the first joining partner 11 and the second joining partner 12, and a respective second connecting means 22 is situated between the second joining partner 12 and each of the third joining partners 13. The connecting means 21, 22 can be, for example, a solder, an adhesive, a sinterable film in the form of a preformed ("green", i.e. unsintered) film lamina or a sinterable paste, wherein within a stack 3 only identical types of connecting means 21, 22 can be used, but also different connecting means 21, 22 in arbitrary combinations with one another. A stack 3 comprising more than two joining partners 11, 12, 13 and more than one connecting means 21, 22 can be processed in all above-explained methods and in all above-explained reactors 7 in the manner respectively described.

In the case of the stack 3 in accordance with FIG. 11, by way of example, the first joining partner 11 can be a metallic baseplate for a power semiconductor module, the second joining partner 12 can be a ceramic lamina 12a metalized on two sides with metallization layers 12t and 12b, and the third joining partners 13 can be semiconductor chips.

Figure 12:
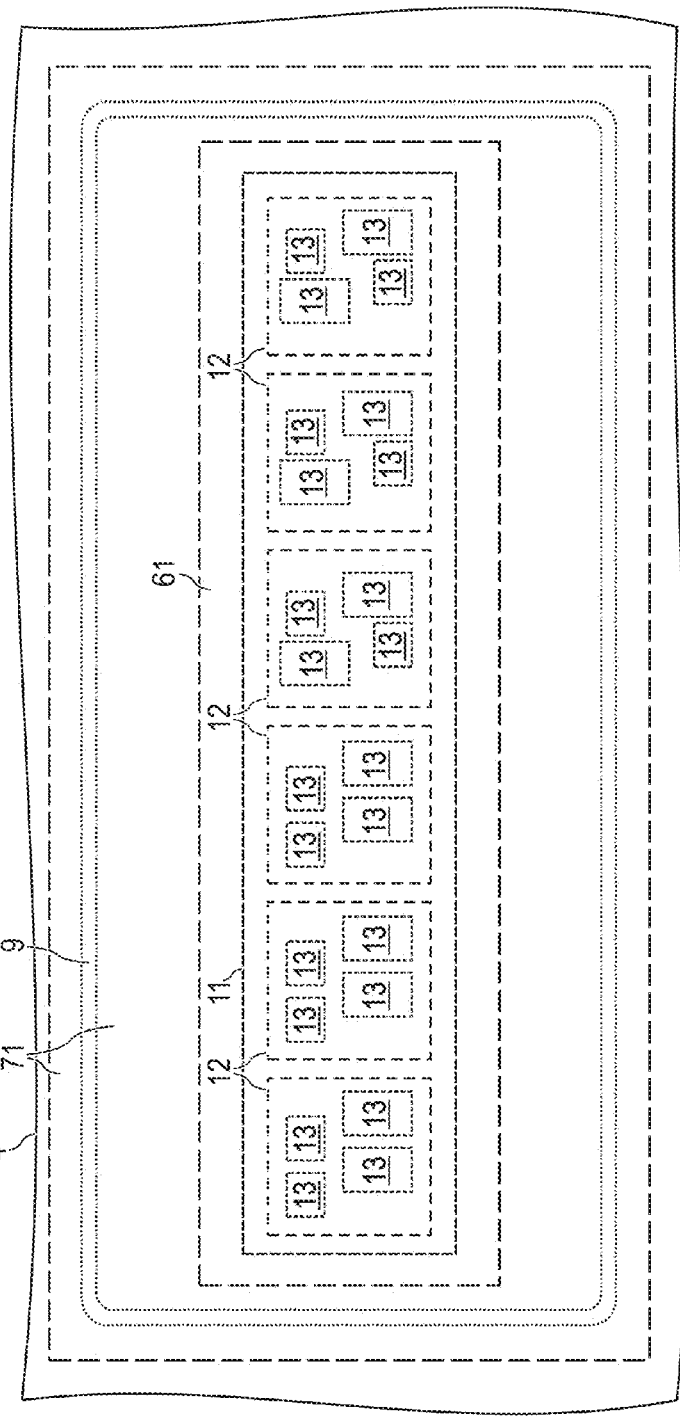
FIG. 12 shows a plan view of a housing element of a reactor, into which a stack comprising a plurality of semiconductor chips, a plurality of metalized ceramic substrates and a metallic baseplate are inserted.

FIG. 12 shows a plan view of a housing element 71 of a reactor, into the pressure chamber 6 of which a stack is inserted, comprising a metallic baseplate 11 for a power semiconductor module, a plurality of ceramic laminates 12 metalized on two sides, and a plurality of semiconductor chips 13. The ceramic laminates 12 are placed onto the baseplate 11, wherein a first connecting means (concealed), is situated between each ceramic lamina 12 and the baseplate 11. Furthermore, at least one semiconductor chip 13 is placed onto each of the ceramic laminates 12, wherein a second connecting means (concealed) is situated between each of the semiconductor chips 13 and the relevant ceramic lamina 12. There is placed across the stack a sealing means 4 embodied as a film, which conceals the baseplate 11, the ceramic laminates 12 and the semiconductor chips 13 and extends across the seal 9, for which reason the components situated below the film, namely baseplate 11, ceramic laminates 12 and semiconductor chips 13, are illustrated by dashed lines. In this case, the semiconductor chips 13 are situated on that side of the ceramic laminates 12 which faces away from the baseplate 11. As yet there are no fixed connections between the baseplate 11 and the metalized ceramic laminates 12, and between the ceramic laminates 12 and the semiconductor chips 13. Such connections are produced only after the reactor has been closed in the context of any of the joining processes described above and using any of the reactors described above, wherein the stack 3 respectively shown should be replaced by the stack shown in FIG. 12. In this case, the arrangement shown in FIG. 12 can be varied arbitrarily.

With a finished joined stack 3 which comprises, for example, at least one baseplate 11 and a metalized ceramic lamina 12 cohesively connected thereto, or which comprises at least one metalized ceramic lamina 12 and a semiconductor chip 13 cohesively connected thereto, or which comprises at least one baseplate 11, a metalized ceramic lamina 12 cohesively connected to the baseplate 11 and a semiconductor chip 13 cohesively connected to the metalized ceramic lamina 12, it is possible to produce a power semiconductor module. For this purpose, a sealing means 4 used for joining the stack 3, as explained above, can remain wholly or partly on the joined stack 3. This is shown by way of example on the basis of power semiconductor modules which are shown in FIGS. 13A, 13B and 13C and in which the stack 3, after the joining process, is electrically contact-connected to one or more electrically conductive contact elements 202 and is arranged in a housing 201 for the purpose of forming the respective power semiconductor modules.

In the case of the power semiconductor module in accordance with FIG. 13A, the contact elements 202 are embodied as connection metal sheets or connection pins, which are electrically conductively connected to regions 40—corresponding thereto—of the stack 3 situated below the film 4. In order to produce the relevant electrically conductive connections, the film 4 situated on the stack 3 after the joining process is partly opened in the regions 40. Moreover, if appropriate, the edges of the film 4 which project laterally beyond the baseplate 11 can be removed. In the case of a film 4 embodied as a pouch, that section of the film 4 which is situated on that side of the baseplate 11 which faces away from the ceramic laminates 12 is also removed.

In the case of the power semiconductor module in accordance with FIG. 13B, an electrically conductive metallization layer is provided as the contact element 202. The metallization layer 202, after the opening of the film 4 in the regions 40, is applied to the stack 3 provided with the film 4 and makes electrically conductive contact with the semiconductor chips 13 and the metallization layer 12t. The metallization layer 202 can be applied, for example, by sputtering or electroplating.

Optionally, in further steps the metallization layer 202 can be structured and provided with further electrically insulating and/or electrically conductive layers, which can in turn be structured, such that the film 4 together with the metallization layer 202 and the optional further electrically insulating and/or electrically conductive layers form a printed circuit board that follows the contour of the stack 3.

It holds true for all configurations of the present inventions that a sealing means 4 which is embodied as a film and which is intended to remain at least partly on the finished joined stack 3 must have a certain adhesive strength. For this purpose, the film 4 can be embodied, for example, as a liquid crystal polymer film, as a polyimide film, as an epoxy resin film or as a plastically deformable non-sintered or incompletely sintered ceramic film which is used in the "green", i.e. non-cured or incompletely cured, state and is cured during the joining process.

If, otherwise, a sealing means 4 embodied as a film is intended to be completely removed from the finished joined stack 3 after the conclusion of the joining process, it is advantageous if the sealing means 4 has the lowest possible adhesive strength. In this case, by way of example, a film composed of polytetrafluoroethylene (PTFE) is suitable.

Furthermore, a sealing means 4 embodied as a film can also be an aluminum film. An aluminum film has no or only very low adhesion to the joining partners.

In other power semiconductor modules, wherein the sealing means 4, as shown in FIG. 13C, is embodied as a sealing bead, the latter can remain completely on the finished stack 3 incorporated in the housing 201. In this example, a plurality of contact elements 202 are provided, which are embodied as connection metal sheets or connection pins and are electrically conductively connected to a semiconductor chip 13 or the metallization 12t in regions 40. As an alternative to connection metal sheets or connection pins, the metallization layer 202 as shown in FIG. 13B could also be provided. Beforehand, however, an insulating layer should be applied to the stack 3 in order to avoid short circuits.

As is furthermore shown by way of example in FIG. 14 on the basis of the reactor 7 explained in FIGS. 1A to 1C, in all configurations wherein a sealing means 4 embodied as a film can be used, the sealing means 4 can also be configured as a double film comprising a first partial film 4a, and a second partial film 4b, which, after the beginning of the joining process, is arranged on that side of the first partial film 4a which faces away from the joining partners 11, 12. When such a double film is used, there is redundancy in case cracks occur in one of the two partial films 4a, 4b, e.g. at sharp edges. The first partial film 4a can comprise, for example, polytetrafluoroethylene (PTFE) or polyimide or a liquid crystal polymer, or can be embodied as a plastically deformable, non-sintered ceramic film. Independently thereof, the second partial film 4b can be embodied as an aluminum film, for example.

As shown by the previous embodiments, for pressing the first joining partner 11, the second joining partner 12 and the interposed connecting means 21 together, the use of a rigid (for example metallic) pressure plunger that acts on the joining partners 11, 12 and the connecting means 21 can optionally be dispensed with. Rather, pressure can be exerted exclusively by the joining partners 11, 12 themselves and/or by an elastic, for example rubber-elastic, or plastically deformable sealing means 4.

This also obviates the use of pressure pads composed of silicone, which, in conventional methods, are introduced between a rigid pressure plunger and the stack 3 and serve to prevent mechanical destruction of the stack 3. This also eliminates the problem of silicone oil, which contaminates the joining partners 11, 12, emerging from such a silicone-containing pressure pad on account of the high contact pressure.

Optionally, it is also possible overall to dispense with having silicone in the pressure chamber 6 during the joining process.

Figure 15:
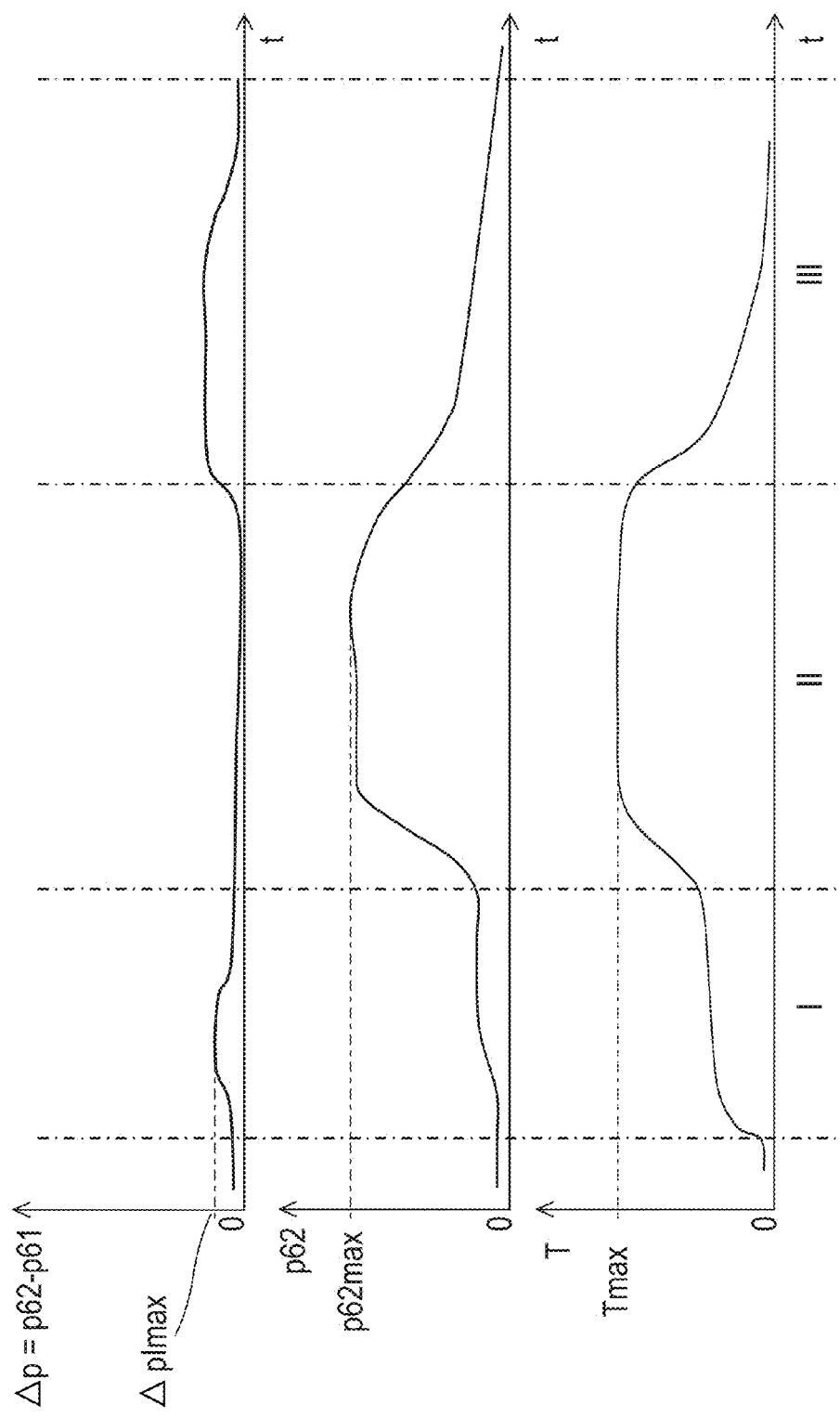
FIG. 15 shows a first example of a temporal profile of pressure and temperature during a sintering or adhesive bonding process.
Figure 16:
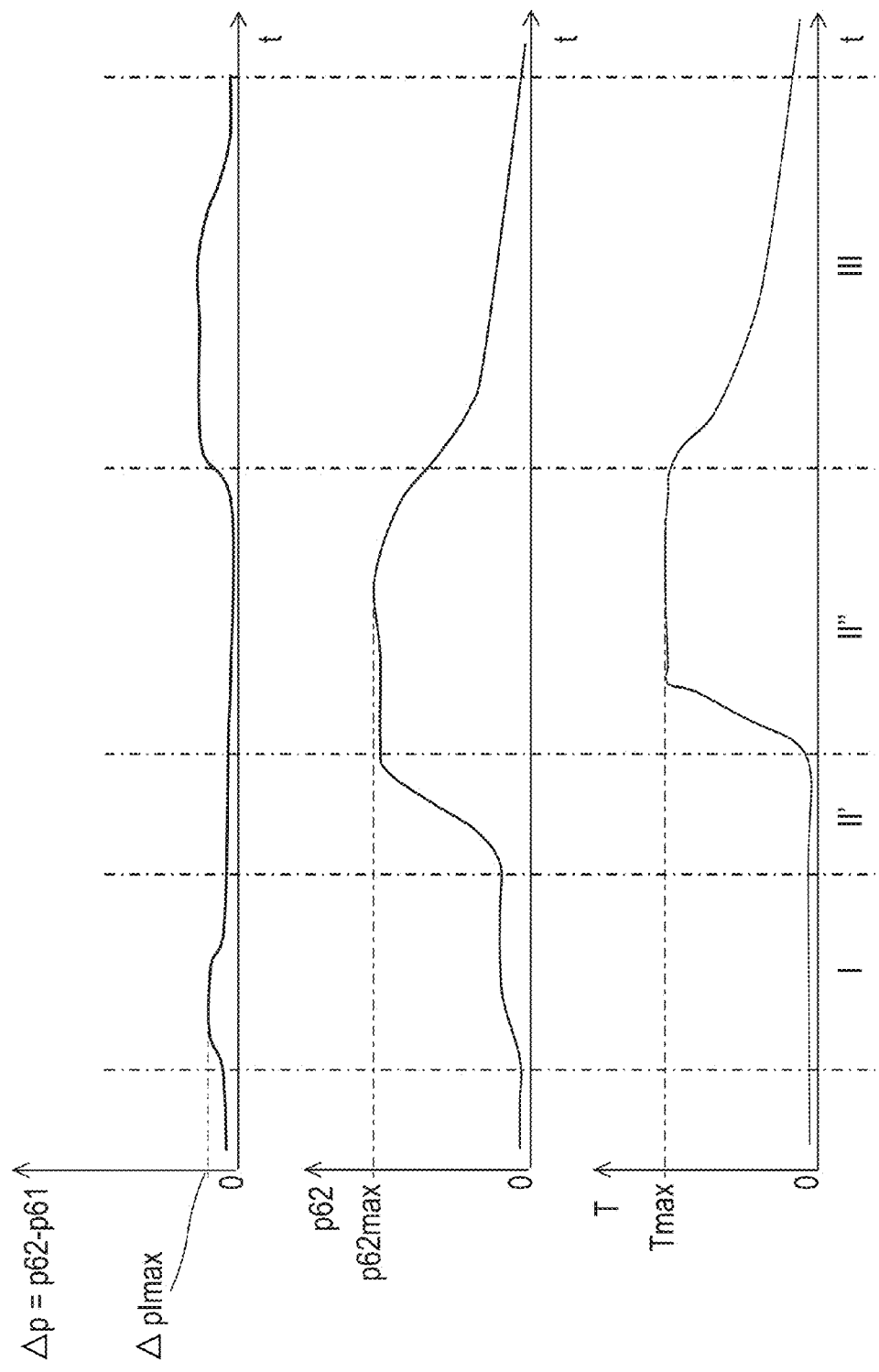
FIG. 16 shows a second example of a temporal profile of pressure and temperature during a sintering or adhesive bonding process.

FIGS. 15 and 16 show two examples of a relative temporal profile of pressure and temperature during one of the joining processes described above, wherein the connecting means 21 and 22 comprise an adhesive, or a sinterable material, which is sintered during the joining process. The upper curve in each case shows the profile of the differential pressure $\Delta p = p62 - p61$, the middle curve shows the profile of p62, and the lower curve shows the profile of the temperature T of the connecting means 21. The pressures p61 and p62 are in each case an absolute pressure. The examples can be used in all configurations in which the pressure chamber 6 is divided into two chamber regions 61 and 62 by a sealing means 4 embodied as a film, the film 4 preventing gas exchange between the chamber regions 61 and 62. For configurations comprising only one chamber region 62, to which pressure can be applied uniformly, only the explained temporal profiles of the pressure p62, and of the temperature T of the one or more connecting means 21 and 22 are applicable. The upper curve with the profile of a differential pressure is not relevant in these cases.

In the first example in accordance with FIG. 15, after the reactor 7 has been closed, a differential pressure $\Delta p = p62 - p61$ is generated in a first time interval I at somewhat elevated temperature. This has the effect that the film 4 becomes soft and in the process is pressed against the surface of the stack 3 situated in the pressure chamber 6, thus giving rise to a gas-tight region 5. In addition, the heating element 8 is preheated. In the time interval I, the differential pressure $\Delta p$ attains a maximum value of $\Delta pImax$ which is at least 20 bar and which can be in the range of 80 bar to 400 bar for example in the case of sintering, or in the range of 20 bar to 50 bar in the case of adhesive bonding.

Afterward, the pressure p62 and the temperature T are increased to a value p62max and Tmax, respectively, in a second time interval II, in order to press the joining partners 11, 12, 13 together and additionally to produce a good thermal contact between the stack 3 and the heating element 8. In this case, the value Tmax is chosen such that it suffices for curing the connecting means 21, 22 in the case of an adhesive, or for sintering in the case of a sinterable material.

After the stack 3 has been sufficiently subjected to heat treatment in the time interval II, the stack 3 and in association therewith the connecting means 21 are cooled. For this purpose, the differential pressure $\Delta p = p62 - p61$ can be increased again in order to increase the thermal coupling between the stack 3 and the housing element 71 acting as a heat sink.

The example in accordance with FIG. 16 firstly shows a first time segment I, which is identical to the time segment I in accordance with FIG. 15 and in which the same processes proceed. After a sealed region 5 has been formed, in which the connecting means 21 is situated, the differential pressure $\Delta p$ can fall, while the pressure p62 is increased further in a time interval II'. During a subsequent time interval II", the temperature T is then also increased. The temperature increase therefore takes place in a delayed manner relative to the increase in the pressure p62. As a result, during sintering, firstly the connecting means 21 is greatly compressed (beginning in the segment II' and maintained in the segment II"). In the segment II", the adhesive bonding or the sintering is completed on account of the high temperature T. In the case of a sintering connection, a high density of the sintered material is thus attained, which is advantageous with regard to the strength of the sintering connection and also with regard to the thermal coupling between the joining partners 11, 12.

In general, especially when producing sintering connections, that is to say if the connecting means 21, 22 comprise an arbitrary sinterable material, it is important that the maximum value of the pressure p62 that is required for the sintering process is attained before the temperature T is increased to the desired sintering temperature. Otherwise, primarily in the case of sintering materials having a nanostructure, there would be the risk of premature sintering, which would lead to the formation of a highly porous structure that could no longer be compressed.

During the production of sintering connections, the temperature Tmax can be, for example, at most 280° or at most 260° C. Independently thereof, the maximum pressure p62max can be at least 50 bar, at least 80 bar or at least 150 bar. Moreover, the maximum pressure p62max, independently of Tmax and independently of its minimum value, can be at most 300 bar or at most 500 bar.

Moreover, in all configurations of the invention, that is to say not just when producing sintering connections, the pressure p61 (if provided in the relevant reactors 7), the pressure p62 and the temperature T can be set independently of one another. In addition, in a manner associated therewith, the pressure chamber 6 can remain cold, that is to say that it does not have to be heated to process temperature.

Figure 17:
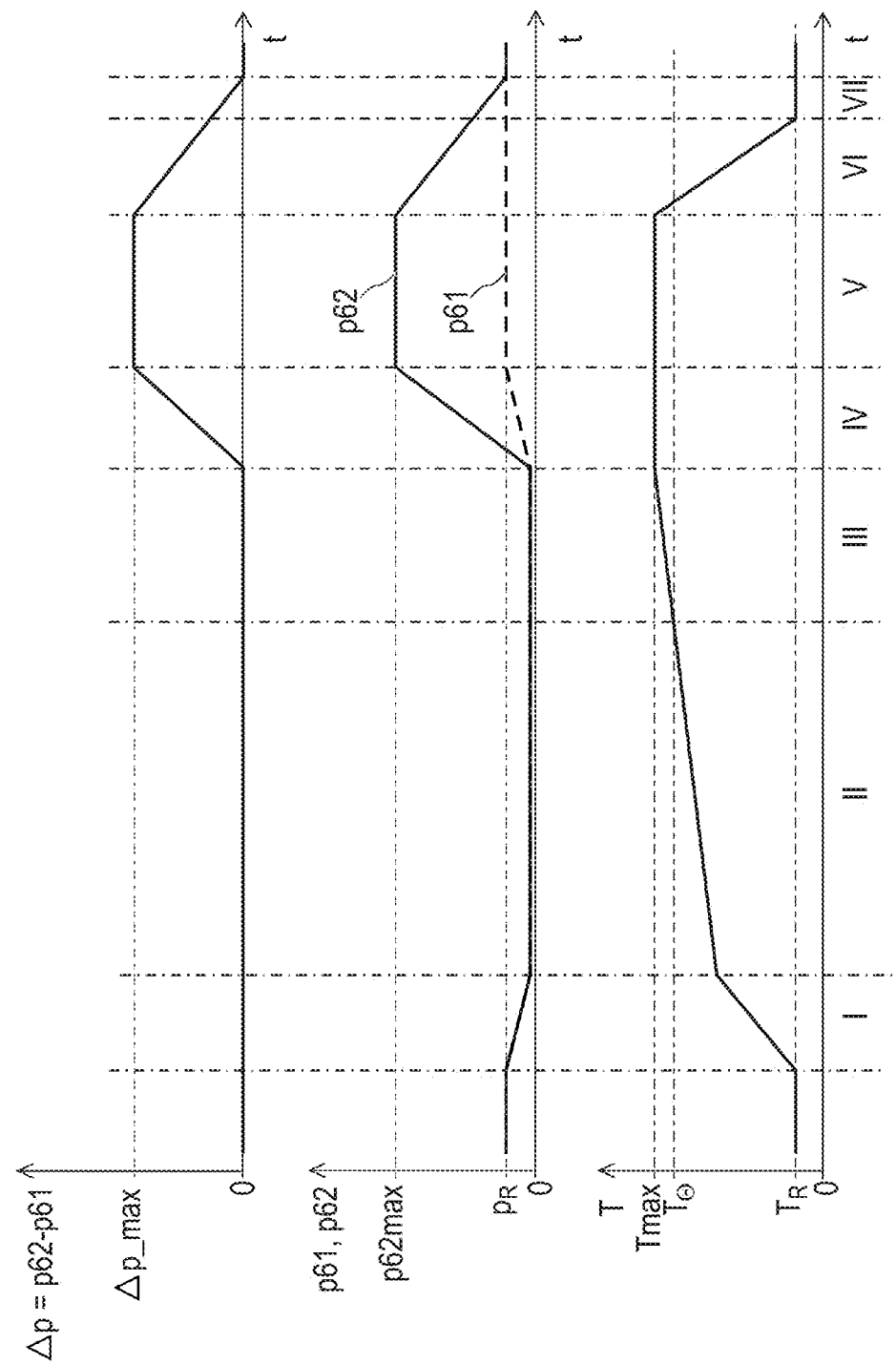
FIG. 17 shows a first example of a temporal profile of pressure and temperature during a diffusion soldering process.
Figure 18:
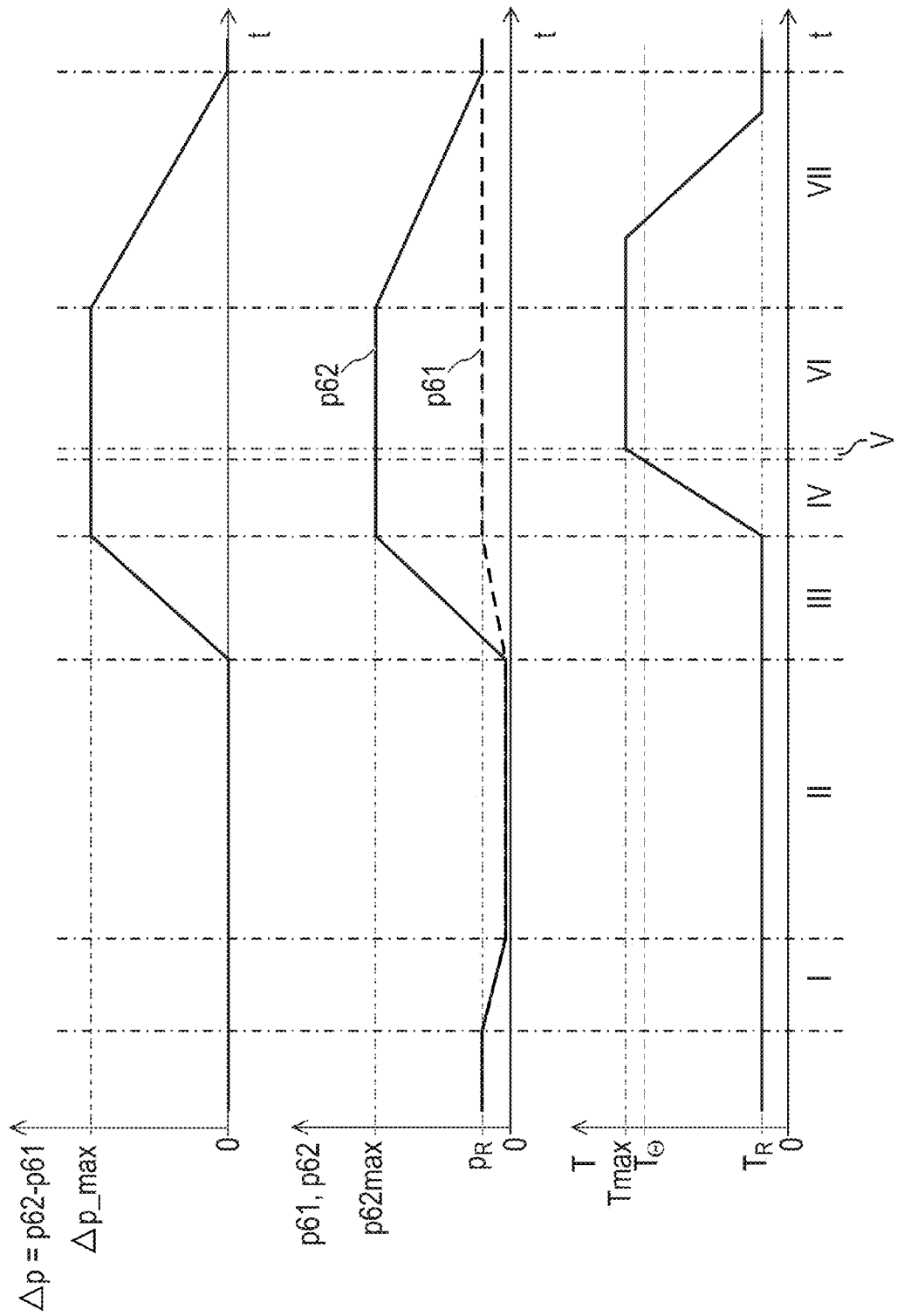
FIG. 18 shows a second example of a temporal profile of pressure and temperature during a diffusion soldering process.

FIGS. 17 and 18 show two examples of a relative temporal profile of pressure and temperature during one of the diffusion soldering processes described above, wherein the connecting means 21, 22 comprises solder which, during the joining process, is heated to above its melting point $T_\theta$ and in this case is melted and then cooled. The upper curve in each case shows the profile of the differential pressure $\Delta p = p62 - p61$, the middle curve shows the profile of p62, and the lower curve shows the profile of the temperature T of the connecting means 21, 22. The pressures p61 and p62 are in each case an absolute pressure. The examples can be used in all configurations in which the pressure chamber 6 is divided into two chamber regions 61 and 62 by a sealing means 4 embodied as a film, between which chamber regions 61 and 62 the film 4 prevents gas exchange. In the configurations comprising only one chamber region 62, to which pressure can be applied uniformly, only the explained temporal profiles of the pressure p62, and of the temperature T of the connecting means 21, 22 are applicable. The upper curve with the profile of a differential pressure is not relevant in these cases.

In the example in accordance with FIG. 17, the closed pressure chamber 6 (in the case of two chamber regions 61 and 62 both chamber regions 61, 62) is initially at normal pressure $p_R$, i.e. at the room pressure surrounding the reactor 7. The pressure chamber 6 (or both chamber regions 61, 62) is then evacuated to a very low absolute pressure, for example less than 50 hPa, such that, in the case of two chamber regions 61, 62, the differential pressure $\Delta p = p62 - p61$ is equal to zero. The evacuation of the first chamber region 61 has the effect that, during the subsequent melting of the solder in the interval III, possible air inclusions can escape from the connecting means 21 in order to achieve soldering that is as free from shrink holes as possible. In addition, in the interval I the temperature T of the connecting means 21, 22 is increased from room temperature $T_R$ to a temperature that is lower than the melting point $T_\theta$ of the connecting means 21, 22. In this case, the heating of the stack 3 with the connecting means 21, 22 and the joining partners 11, 12 is facilitated because the stack 3 as explained above facilitated, since, on account of the differential pressure of $\Delta p = \text{zero}$, there is only a low thermal coupling between the stack 3 and the housing element 71.

In a subsequent interval II, the temperature T is increased further at a heating rate that is lower than the heating rate in the interval I, until the melting point $T_\theta$ of the connecting means 21, 22 is attained at the end of the interval II, with the result that the connecting means 21, 22 liquefies. After attaining the melting point $T_\theta$, possible air inclusions can escape from the solder.

In a subsequent interval III, the temperature T is additionally increased up to a maximum temperature Tmax that is higher than the melting point $T_\theta$, such that complete melting of the connecting means 21, 22 is ensured. The melting point $T_\theta$ can be 220° C., for example.

In a subsequent interval IV, the pressure p62 is increased to a maximum pressure p62max, for example 50 bar, and the pressure p61 is increased to ambient pressure $p_R$, for example 1 bar, such that the maximum differential pressure $\Delta p\_max$ is 49 bar in the example mentioned. Optionally, the pressure p61 can be brought to ambient pressure $p_R$ again in the interval IV. As a result of the pressure p62 being increased with a molten connecting means 21, 22, the joining partners 11, 12, 13 are pressed together by the pressure p62. In this case, the molten connecting means 21, 22 is compressed to form a very thin layer, which fosters alloying-through of the solder, since in this case it is of importance that material from at least one of the joining partners 11, 12, 13 adjacent to the connecting means 21, 22 penetrates into the liquid solder and in this case penetrates through the latter as completely as possible. A thin solder layer reduces the required diffusion distances, which fosters alloying-through.

In a subsequent interval V, the pressures p62 and p61 and the temperature T are kept constant at a high level in order to achieve as complete alloying-through of the solder as possible. The example in accordance with FIG. 17 is intended to illustrate the fact that the temperature T can also be increased (interval IV) and/or kept at a high level (interval V) if, as a result of a high differential pressure $\Delta p$, there is a good thermal coupling between the stack 3 and the housing element 71. In a departure therefrom, however, the pressure p61 could also be increased together with the pressure p62 in the interval IV and be held at a high level in the interval V, to be precise in both cases such that the differential pressure $\Delta p = p62 - p61$ is equal to zero, or is only a very small value, for example less than 1 bar or less than 5 bar.

With a further interval VI, a cooling phase ensues until the temperature T has attained room temperature $T_R$ at the end of the interval VI and the pressure chamber 6 or the chamber regions 61, 62 can be brought to ambient pressure $p_R$. As an alternative thereto, the pressure chamber 6 or the chamber regions 61, 62 can be brought to ambient pressure $p_R$ upon or else before attaining the room temperature $T_R$, if the temperature T of the connecting means 21, 22 has already decreased to an extent such that the joined stack 3 has a sufficient strength.

In the example in accordance with FIG. 18, the closed pressure chamber 6 (in the case of two chamber regions 61 and 62 both chamber regions 61, 62) is initially at normal pressure $p_R$. The pressure chamber 6 (or both chamber regions 61, 62) is then evacuated to a very low absolute pressure, for example less than 50 hPa, during an interval I at room temperature $T_R$, such that, in the case of two chamber regions 61, 62, a differential pressure $\Delta p = p62 - p61$ of exactly zero is present. These values are kept constant during a subsequent interval II.

In a subsequent interval III, the pressure p62 is set to a high pressure p62max, for example 41 bar, while the pressure p61 is increased to ambient pressure $p_R$, for example 1 bar, which overall brings about an increase in the differential pressure $\Delta p = p62 - p61$ to a maximum value $\Delta p\_max$ at 40 bar. As a result, firstly the joining partners 11, 12, 13 involved are pressed together on account of the high value of p62, and secondly the high differential pressure $\Delta p$ causes the stack 3 to be pressed on in the direction of housing element 71.

Afterward, the temperature T is increased during an interval IV with pressures p61, p62 being held, until the melting point $T_\theta$ of the connecting means 21, 22 is attained at the end of the interval IV, such that the connecting means 21, 22 liquefies and the joining partners 11, 12, 13 are pressed together by the high value of pressure p62. On account of the already molten connecting means 21, 22, each molten connecting means 21, 22 is compressed to form a very thin layer.

In order to ensure complete melting of the connecting means 21, 22, in a subsequent interval V the temperature T is additionally increased beyond the melting point $T_\theta$ up to a maximum temperature Tmax.

After the pressures p62 and p61 and the temperature T have been kept constant at a high level during a subsequent interval VI, in order to achieve as complete alloying-through as possible, in a further interval VII a cooling phase ensues until the temperature T has attained room temperature $T_R$ at the end of the interval VI and the pressure chamber 6 or the chamber regions 61, 62 can be brought to ambient pressure $p_R$.

The temperature and pressure values mentioned in the previous embodiments should be understood merely as examples. The same also applies to the relative profiles of the pressures p61, p62 and the temperature T. In principle, any other values and profiles can be set.

In all configurations of the invention, the pressures p62 and, if necessary, p61 can be provided by the relevant pressure connections 82 and 81, respectively, being connected to compressors and/or vacuum pumps and/or pressure accumulators. In order that the energy stored in the compressed gases cannot escape from the pressure chamber 6 in an unused manner after the conclusion of the respective processes, two or more pressure chambers 6 can be coupled to one another. One example of this is shown in FIG. 19. Here a plurality of reactors 7a, 7b, 7c are connected to a common double compressor 100, which generates the pressures p61 and p62 and forwards them to the chamber regions 61 and 62, respectively, of the pressure chamber 6 of the respective reactor 7a, 7b, 7c.

Open valves 161 and 162, respectively, are provided in the common pressure connection lines. In addition, separate valves 181 and 182 are provided for each of the reactors 7a, 7b, 7c. The valves 1812, 182 have to be opened in order that the pressures p61 and p62, respectively, can pass via the respective pressure connections 81 and 82 of the relevant first chamber region 61 and second chamber region 62, respectively. Moreover, a pressure equalizing line 160 can be provided for each of the reactors 7a, 7b, 7c, and pressure equalization between the atmosphere surrounding the reactors 7 and the first chamber region 61 and respectively second chamber region 62 can take place via this line, for which purpose corresponding valves 191 and 192, respectively, have to be opened.

If each of the reactors 7a, 7b, 7c, as explained above, is then equipped with a stack 3, the valves 191 and 192 of each reactor 7a, 7b, 7c are closed. The valves 161 and 162 are again opened, as are the valves 181 and 182 of the first reactor 7a, such that pressure p61 is applied to the first chamber region 61 of the first reactor 7a via the first pressure connection 81 of the first reactor 7a and pressure p62 is applied to the second chamber region 62 of the first reactor 7a via the second pressure connection 82 of the first reactor 7a. The valves 161 and 162 can then be closed again.

If the processing in the first reactor 7a has concluded to an extent such that the pressures p61 and p62 present in the chamber regions 61, 62 of the first reactor 7a are no longer required, the valves 181 and 182 of the second reactor 7b are opened, such that both a pressure equalization between the first chamber region 61 of the first reactor 7a and the first chamber region 61 of the second reactor 7b and a pressure equalization between the second chamber region 62 of the first reactor 7a and the second chamber region 62 of the second reactor 7b can take place. This prevents the loss of part of the energy that would otherwise be lost, which loss would arise if the pressure equalization, required for opening the first reactor 7a, between the chamber regions 61, 62 thereof took place directly with the atmosphere surrounding the reactors 7a, 7b, 7c, without a pressure equalization between the chamber regions 61 and 62 of the first reactor 7a and the corresponding chamber regions 61 and 62 of the second reactor 7b having taken place beforehand. Since the chamber regions 61 and 62 of the second reactor 7b, on account of the pressure equalization, can be brought to the required pressures p61 and p62, respectively, only partly but not completely, the valves 181 and 182 of the first reactor 7a are closed after the pressure equalization, and the valves 161 and 162 are opened, as a result of which the pressures p61 and p62 are then present in the chamber regions 61 and 62, respectively, of the second reactor 7b.

Correspondingly, pressures p61 and p62 also "stored" in the chamber regions 61 and 62, respectively, of the second reactor 7b, can be passed on partly to the corresponding chamber regions 61 and 62, respectively, of the third reactor 7c.

For controlling this method, a control unit 110 is provided, which can control the opening and closing of the reactors 7a, 7b and 7c, and the opening and closing of all of the valves shown, the heating elements 8 of the respective reactors 7a, 7b, 7c, and the compressor 100. The requisite control lines from the control unit 110 to the valves and the compressor 100 are not illustrated.

The installation comprising the control unit 110, the compressor 100 and the valves can be embodied such that the pressures p61 and p62 can be varied continuously, for example in a range of 20 hPa to 300 bar, or 20 hPa to 330 bar.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for producing a composite, wherein at least two joining partners are fixedly connected to one another, the method comprising:
    providing a first joining partner and a second joining partner;
    providing a connecting means;
    providing a sealing means;
    providing a reactor having a pressure chamber;
    providing a heating element;
    arranging the first joining partner, the second joining partner and the connecting means in the pressure chamber such that the connecting means is interposed between the first joining partner and the second joining partner and such that the first joining partner is in physical contact with the heating element;
    producing a gas-tight region in which the connecting means is arranged;
    producing a gas pressure in the pressure chamber outside the gas-tight region such that the gas pressure acts on the gas-tight region and presses the first joining partner, the second joining partner and the connecting means together with at least 20 bar;
    heating the first joining partner, the second joining partner and the connecting means by means of the heating element to a predefined maximum temperature of at least 210° C.; and
    subsequently cooling the first joining partner, the second joining partner and the connecting means to produce the composite.

2. The method according to claim 1, wherein the sealing means is a film.

3. The method according to claim 2, wherein the film comprises polytetrafluoroethylene (PTFE), polyimide, a liquid crystal polymer, a plastically deformable non-sintered ceramic film, or an aluminum film.

4. The method according to claim 2, wherein the film is a double film comprising a first partial film and a second partial film, the first partial film comprising polytetrafluoroethylene (PTFE), polyimide, a liquid crystal polymer or a plastically deformable non-sintered ceramic film, the second partial film being an aluminum film arranged on a side of the first partial film facing away from the joining partners.

5. The method according to claim 2, wherein the film has a thickness of 20 μm to 500 μm.

6. The method according to claim 2, wherein the film has a thickness of 100 μm to 250 μm.

7. The method according to claim 2, wherein the first joining partner, the second joining partner and the connecting means are completely enclosed by the film such that the film forms a gas-tight, closed pouch in which the first joining partner, the second joining partner and the connecting means are arranged.

8. The method according to claim 2, wherein:
the pressure chamber has a first housing element and a second housing element;
the film or a frame connected to the film is clamped in between the first housing element and the second housing element such that the pressure chamber is subdivided by the film into a first chamber region and a second chamber region; and
the first joining partner, the second joining partner and the connecting means are arranged in the first chamber region after the film is clamped in between the first housing element and the second housing element.

9. The method according to claim 8, wherein:
the pressure chamber has at least one spring element;
the at least one spring element, if a pressure in the second chamber region exceeds a pressure in the first chamber region by a specific absolute value, is pre-stressed such that the heating element makes thermal contact with the first housing element; and
the at least one spring element at least partly thermally decouples the heating element from the first housing element if a differential pressure between the pressure in the second chamber region and the pressure in the first chamber region is less than the specific absolute value.

10. The method according to claim 8, wherein the arrangement of the first joining partner, the second joining partner and the connecting means bears on the film such that the film is in thermal contact with the heating element if a pressure in the second chamber region exceeds a pressure in the first chamber region by a specific absolute value, and wherein the arrangement of the first joining partner, the second joining partner and the connecting means is wholly or at least partly thermally decoupled from the heating element because of its inherent weight acting on the film if the differential pressure between the pressure in the second chamber region and the pressure in the first chamber region is less than the specific absolute value.

11. The method according to claim 8, wherein a pressure is generated in the second chamber region, and wherein a further pressure is generated in the first chamber region such that a contact pressure with which the first joining partner, the second joining partner and the connecting means are pressed in a direction of the heating element is set in a variable manner by way of a differential pressure between the pressure in the second chamber region and the gas pressure in the first chamber region.

12. The method according to claim 1, wherein the sealing means is a sealing bead.

13. The method according to claim 12, wherein the sealing bead is formed by applying a soft material to the arrangement comprising the first joining partner, the second joining partner and the connecting means and curing the soft material.

14. The method according to claim 13, wherein the soft material is cured by r-treating the soft material with at least one of UV irradiation, moisture, and heat treatment.

15. The method according to claim 12, wherein the soft material is a silicone or a silicone-based composition.

16. The method according to claim 1, further comprising ensuring the pressure chamber remains free of silicone during production of the composite.

17. The method according to claim 1, wherein the first joining partner, the second joining partner and the connecting means are pressed together without the use of a rigid pressure plunger.

18. The method according to claim 1, wherein at least one of the joining partners is a metalized ceramic carrier having a base area provided by a side of the metalized ceramic carrier having the largest area, and wherein the heating element, relative to the base area, has a heat capacity in a range from 0.5 J/(K·cm$^2$) to 5 J/(K·cm$^2$).

19. The method according to claim 1, wherein at least one of the joining partners is a metalized ceramic carrier having a base area provided by a side of the metalized ceramic carrier having the largest area, and wherein the heating element, relative to the base area, has a heat capacity in a range from 5 W/cm$^2$ to 50 W/cm$^2$.

20. The method according to claim 1, wherein the first joining partner is a metalized ceramic carrier and the second joining partner is a semiconductor chip.

21. The method according to claim 1, wherein the first joining partner is a metallic plate and the second joining partner is a metalized ceramic carrier.

22. The method according to claim 1, wherein:
the gas pressure in the pressure chamber is changed in accordance with a temporally variable pressure profile in which a maximum gas pressure is attained; and
the first joining partner, the second joining partner and the connecting means are heated by means of the heating element in accordance with a temporally variable temperature profile in which the maximum temperature is attained.

23. The method according to claim 22, wherein:
the connecting means is a solder which is at least partly alloyed through during the heating of the first joining partner, the second joining partner and the connecting means such that a multiplicity of bridges are formed in the connecting means, at least 90 percent by volume of each bridge comprising one or more intermetallic phases, each bridging extending continuously between the first joining partner and the second joining partner;
the maximum temperature is at least 210° C. and at most 260° C.; and
the maximum gas pressure is at least 20 bar and at most 80 bar.

24. The method according to claim 22, wherein:
the connecting means is a silver-containing paste;
the maximum temperature is at most 280° C. or at most 260° C.; and
the maximum gas pressure is at least 80 bar and at most 400 bar.

25. The method according to claim 1, wherein the pressure chamber has a volume of less than or equal to 1000 ml.

26. The method according to claim 1, wherein the pressure chamber has a volume of less than or equal to 200 ml.

27. The method according to claim 1, wherein the pressure chamber has in each lateral direction a width that is larger by a maximum of 1 cm than a largest width of the stack in each lateral direction.

28. The method according to claim 2, further comprising mounting the composite together with at least one part of the film in a housing.

29. A method for producing a composite, the method comprising:
- arranging a connecting means between a first joining partner and a second joining partner in a pressure chamber of a reactor;
- producing a gas-tight region in which the connecting means is arranged;
- producing a gas pressure in the pressure chamber outside the gas-tight region such that the gas pressure acts on the gas-tight region and presses the first joining partner, the second joining partner and the connecting means together with at least 20 bar;
- heating the first joining partner, the second joining partner and the connecting means to a maximum temperature of at least 210° C., using a heating element arranged in the pressure chamber and in physical contact with the first joining partner; and
- subsequently cooling the first joining partner, the second joining partner and the connecting means to produce the composite.

* * * * *